(12) United States Patent
Lenhart et al.

(10) Patent No.: US 12,368,429 B2
(45) Date of Patent: Jul. 22, 2025

(54) MACHINE-LEARNING BASED TUNING ALGORITHM FOR DUPLEXER SYSTEMS

(71) Applicant: Apple Inc., Cupertino, CA (US)

(72) Inventors: Björn Lenhart, Nuremberg (DE); Joonhoi Hur, Sunnyvale, CA (US); Harald Pretl, Schwertberg (AT); Rastislav Vazny, Sunnyvale, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 18/680,493

(22) Filed: May 31, 2024

(65) Prior Publication Data

US 2024/0322782 A1    Sep. 26, 2024

Related U.S. Application Data

(62) Division of application No. 17/366,692, filed on Jul. 2, 2021, now Pat. No. 12,040,772.

(51) Int. Cl.
*H03H 7/40* (2006.01)
*G06N 20/00* (2019.01)
*H04B 1/04* (2006.01)
*H04B 17/10* (2015.01)
*H04B 17/12* (2015.01)

(52) U.S. Cl.
CPC .............. *H03H 7/40* (2013.01); *G06N 20/00* (2019.01); *H04B 1/0458* (2013.01); *H04B 17/104* (2015.01); *H04B 17/12* (2015.01)

(58) Field of Classification Search
None
See application file for complete search history.

(56) References Cited

U.S. PATENT DOCUMENTS

| 5,187,454 | A  | 2/1993  | Collins et al.   |
|-----------|----|---------|------------------|
| 8,854,155 | B2 | 10/2014 | Mikhemar et al.  |
| 10,680,724| B2 | 6/2020  | Laughlin         |
| 10,741,363| B1 | 8/2020  | Burry et al.     |
| 2005/0118949 | A1 | 6/2005 | Allen et al.    |
| 2007/0194859 | A1 | 8/2007 | Brobston et al. |

(Continued)

FOREIGN PATENT DOCUMENTS

CN    107483168 B    11/2019

*Primary Examiner* — Wilson Lee
(74) *Attorney, Agent, or Firm* — FLETCHER YODER PC

(57) ABSTRACT

This disclosure provides techniques for impedance matching. A radio frequency (RF) device includes a power detector to determine a transmitter leakage and a post-processing unit to determine a receiver leakage, and determines if isolation is acceptable based on the leakages. The RF device may include a device for measuring antenna impedance. Otherwise, the RF device may select multiple tuner settings (e.g., capacitor values) for test signals to be transmitted and received at a target frequency, determine multiple sets of leakage values, determine multiple reflection coefficients based on the multiple sets of leakage values, and determine an estimated antenna impedance at the target frequency based on the reflection coefficients. The RF device then determines impedance tuner settings based on the measured or estimated antenna impedance. Alternatively, the RF device determines impedance tuner settings using an inverse machine-learning model based on a determined matching impedance.

20 Claims, 14 Drawing Sheets

(56) References Cited

U.S. PATENT DOCUMENTS

| | | |
|---|---|---|
| 2011/0299437 A1* | 12/2011 | Mikhemar ............ H04B 1/582 |
| | | 370/278 |
| 2012/0051409 A1 | 3/2012 | Brobston et al. |
| 2014/0176388 A1* | 6/2014 | Van Liempd ............ H03H 7/38 |
| | | 333/32 |
| 2015/0038094 A1 | 2/2015 | Maxim et al. |
| 2015/0312018 A1 | 10/2015 | Li et al. |
| 2016/0126904 A1 | 5/2016 | Kuo et al. |
| 2016/0276983 A1 | 9/2016 | Vallancourt et al. |
| 2017/0146591 A1 | 5/2017 | Nobbe et al. |
| 2017/0230066 A1 | 8/2017 | Little et al. |
| 2018/0183478 A1 | 6/2018 | Onaka et al. |
| 2019/0334565 A1 | 10/2019 | Itkin |
| 2020/0279963 A1* | 9/2020 | Yoscovich ............ H10F 19/902 |
| 2021/0050185 A1 | 2/2021 | Martinez et al. |
| 2021/0136601 A1 | 5/2021 | Winslow et al. |
| 2022/0078059 A1 | 3/2022 | Dorn et al. |
| 2023/0102583 A1* | 3/2023 | Mesquita ............ H04B 1/581 |
| | | 455/78 |
| 2023/0291433 A1* | 9/2023 | Benjamin ............ H04B 1/525 |
| 2023/0308193 A1* | 9/2023 | Banin .................. H04W 52/36 |

* cited by examiner

MACHINE-LEARNING BASED TUNING ALGORITHM FOR DUPLEXER SYSTEMS

CROSS REFERENCE TO RELATED APPLICATIONS

This application is a divisional of U.S. application Ser. No. 17/366,692, filed on Jul. 2, 2021, entitled "MACHINE-LEARNING BASED TUNING ALGORITHM FOR DUPLEXER SYSTEMS," the disclosure of which is incorporated by reference in its entirety for all purposes.

BACKGROUND

The present disclosure relates generally to wireless communication, and more specifically to tuning an impedance tuner to match an impedance of an antenna in a radio frequency (RF) device.

In an electronic device, a transmitter and a receiver may each be coupled to an antenna to enable the electronic device to both transmit and receive wireless signals. The electronic device may include isolation circuitry (e.g., an electrical balanced duplexer (EBD) or a phase balanced duplexer (PBD)) that isolates the transmitter from reception signals received over a first frequency, and isolates the receiver from transmission signals sent over a second frequency (e.g., thus implementing frequency division duplex (FDD) operations). In this manner, a duplexer may reduce interference between the transmission and reception signals.

However, effectiveness of the isolation between the transmitter and the receiver may be based on an impedance of an antenna associated with each of the transmitter and the receiver. For a radio frequency device, the current at the input of the antenna (e.g., passing through an antenna input impedance ($Z_L$)) should be equal to or approximately equal to the current at the output of the antenna (e.g., passing through an antenna output impedance ($Z_O$)) to efficiently transmit the transmission signals and receive the reception signals while maintaining a threshold level of isolation between the transmitter and the receiver. To provide an acceptable level of isolation, an impedance tuner of the electronic device may attempt to match, as closely as possible, an impedance of the antenna. However, determining the impedance of the antenna may be difficult.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

An aspect of the disclosure provides an electronic device. The electronic device includes an antenna, a transmitter communicatively coupled to the antenna, a receiver communicatively coupled to the antenna, a duplexer communicatively coupled to the transmitter and the receiver, a voltage standing wave ratio detector coupled to the duplexer and the antenna, and a processing circuitry communicatively coupled to the impedance tuner. The duplexer includes an impedance tuner. The voltage standing wave ratio detector determines an antenna impedance at the antenna. The processing circuitry adjusts the impedance tuner based on the antenna impedance.

Another aspect of the disclosure provides an electronic device that includes an antenna, a transmitter communicatively coupled to the antenna and that sends a transmission signal via the antenna, a receiver communicatively coupled to the antenna and that receives a reception signal via the antenna, isolation circuitry communicatively coupled to the transmitter and the receiver, and a processing circuitry. The isolation circuitry isolates the transmitter from the reception signal and isolates the receiver from the transmission signal. The isolation circuitry incudes an impedance tuner that outputs an impedance that correlates to an antenna impedance of the antenna. The processing circuitry applies multiple test impedance settings to the impedance tuner. Moreover, the processing circuitry determines multiple transmitter leakage values and multiple receiver leakage values based on applying the multiple test impedance settings. The processing circuitry also estimates the antenna impedance as an estimated antenna impedance based on the multiple transmitter leakage values and the multiple receiver leakage values, and adjusts the impedance tuner based on the estimated antenna impedance.

Another aspect of the disclosure provides an isolation circuitry of an electronic device. The isolation circuitry includes a balanced duplexer system communicatively coupled to a transmitter and a receiver of the electronic device, processing circuitry, and a machine-learning model. The balanced duplexer system includes an impedance tuner that outputs an impedance. The processing circuitry determines a transmitter leakage of the transmitter and a receiver leakage of the receiver, and determines a matching impedance based on the transmitter leakage and the receiver leakage. The machine-learning model determines a tuning state of the impedance tuner based on the matching impedance. The impedance tuner outputs the impedance based on the tuning state.

Various refinements of the features noted above may exist in relation to various aspects of the present disclosure. Further features may also be incorporated in these various aspects as well. These refinements and additional features may exist individually or in any combination. For instance, various features discussed below in relation to one or more of the illustrated embodiments may be incorporated into any of the above-described aspects of the present disclosure alone or in any combination. The brief summary presented above is intended only to familiarize the reader with certain aspects and contexts of embodiments of the present disclosure without limitation to the claimed subject matter.

BRIEF DESCRIPTION OF THE DRAWINGS

Various aspects of this disclosure may be better understood upon reading the following detailed description and upon reference to the drawings described below in which like numerals refer to like parts.

DETAILED DESCRIPTION OF SPECIFIC EMBODIMENTS

Figure 1:
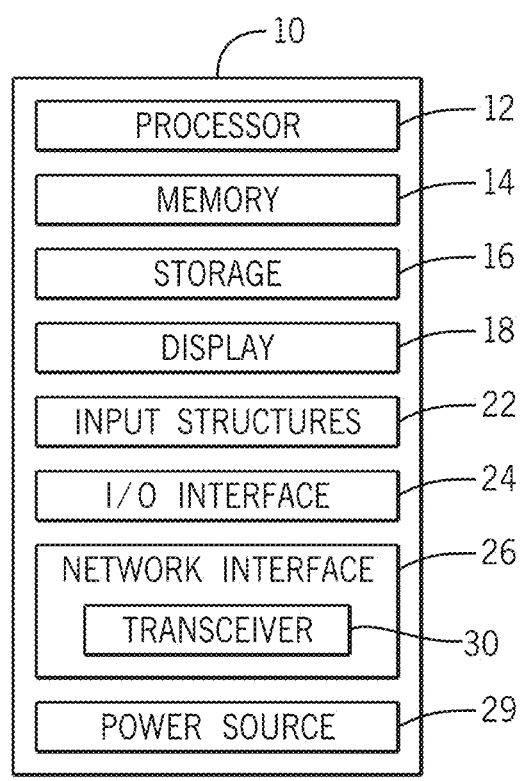
FIG. 1 is a block diagram of an electronic device, according to an embodiment of the present disclosure.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. Furthermore, the particular features, structures, or characteristics may be combined in any suitable manner in one or more embodiments. Use of the term "approximately," "near," "about", and/or "substantially" should be understood to mean including close to a target (e.g., design, value, amount), such as within a margin of any suitable or contemplatable error (e.g., within 0.1% of a target, within 1% of a target, within 5% of a target, within 10% of a target, within 25% of a target, and so on).

This disclosure is directed to tuning an impedance tuner to match or approximately match (e.g., correlate to) an antenna impedance. As previously mentioned, a radio frequency device (e.g., electronic device) may transmit transmission signals and receive reception signals simultaneously or concurrently on different frequencies. The radio frequency device may include an isolation circuitry (e.g., an electrical balanced duplexer or a phase balanced duplexer) that isolates a transmitter from the reception signals and a receiver from the transmission signals. However, effectiveness of the isolation between the transmitter and the receiver may be based on an impedance tuner of the isolation circuitry matching an impedance of an antenna (e.g., antenna impedance) associated with the transmitter and the receiver. To provide an acceptable level of isolation, an impedance tuner of the radio frequency device may match or correlate to the impedance of the antenna (e.g., tuner impedance). However, determining the antenna impedance may be difficult. Moreover, using previous impedance tuner settings for the matching may result in overshooting or unnecessarily tuning the impedance tuner, resulting in a mismatched tuner impedance and therefore poorer isolation performance. In such circumstances, the radio frequency device may inefficiently retune the impedance tuner until the threshold isolation is achieved.

Embodiments herein provide various apparatuses and techniques for efficiently and accurately determining the antenna impedance. To do so, the embodiments disclosed herein include a radio frequency device including a power detector to determine a leakage signal of the transmitter (e.g., a transmitter leakage) and a post-processing unit to determine a leakage signal of the receiver (e.g., a receiver leakage). The radio frequency device may determine if isolation is acceptable (e.g., above a predetermined isolation threshold) based on the transmitter and receiver leakages.

In some embodiments, the radio frequency device may include at least one device for determining the antenna impedance. For example, the radio frequency device may include a voltage standing wave ratio (VSWR) detector or a like device that is suitable for measuring the antenna impedance. In such embodiments, in response to isolation performance not being acceptable, the radio frequency device determines (e.g., measures) the antenna impedance using the VSWR detector. The radio frequency device may determine and apply impedance tuner settings (e.g., capacitor and/or inductor values of the impedance tuner) for a target tuner impedance based on the antenna impedance (e.g., matching or approximately matching the antenna impedance).

In embodiments in which the radio frequency device does not include the at least one device for determining the antenna impedance, in response to the isolation not being acceptable, the radio frequency device may select three test tuner settings for test signals to be transmitted and received at a target frequency. That is, the radio frequency device may select three capacitor and/or inductor values for the impedance tuner at the target frequency. The radio frequency device may subsequently send and receive test signals at the target frequency using the three test settings, resulting in three sets of transmitter leakage and receiver leakage values. The radio frequency device may determine three reflection coefficients based on the three sets of transmitter leakage and receiver leakage values, and determine an estimated antenna impedance at the target frequency based on the three reflection coefficients. Moreover, the radio frequency device may determine and apply impedance tuner settings based on the estimated antenna impedance.

In additional embodiments in which the electronic device does not include the at least one device for determining the antenna impedance, the radio frequency device may iteratively determine antenna impedance, such as by using an optimization algorithm (e.g., downhill simplex and/or gradient descent algorithms). Specifically, the radio frequency device may provide the transmitter leakage and the receiver leakage at a target frequency to an algorithm control unit of the radio frequency device that executes the optimization algorithm. The algorithm control unit may provide a matching impedance correlating to the antenna impedance to a machine-learning model. The machine-learning model may apply an inverse model that receives the matching impedance and the target frequency to determine impedance tuner settings (e.g., capacitor and/or inductor values of the impedance tuner) that output the matching impedance at the target frequency. In this manner, the radio frequency device may efficiently and accurately determine the impedance tuner settings for the matching impedance (e.g., in a single tuning) instead of unnecessarily making numerous tuning adjustments until the transmitter and receiver are sufficiently isolated (e.g., within an acceptable level of isolation). The radio frequency device may then tune the capacitor values (e.g., apply impedance tuner settings) of the impedance tuner using the determined impedance tuner settings.

Additionally, rather than using a single machine-learning model (which may be complex and use excessive computing resources to execute), the radio frequency device may store multiple smaller models in a lookup table that correspond to different reflection coefficients. The radio frequency device may determine a reflection coefficient, and use the corresponding model of the multiple models to determine and apply the impedance tuner settings.

With the foregoing in mind, FIG. 1 is a block diagram of an electronic device 10 (e.g., a radio frequency device), according to an embodiment of the present disclosure. The electronic device 10 may include, among other things, one or more processors 12 (collectively referred to herein as a single processor for convenience, which may be implemented in any suitable form of processing circuitry), memory 14, nonvolatile storage 16, a display 18, input structures 22, an input/output (I/O) interface 24, a network interface 26, and a power source 29. The various functional blocks shown in FIG. 1 may include hardware elements (including circuitry), software elements (including computer code stored on a computer-readable medium) or a combination of both hardware and software elements. The processor 12, memory 14, the nonvolatile storage 16, the display 18, the input structures 22, the input/output (I/O) interface 24, the network interface 26, and/or the power source 29 may each be communicatively coupled directly or indirectly (e.g., through or via another component, a communication bus, a network) to one another to transmit and/or receive data between one another. It should be noted that FIG. 1 is merely one example of a particular implementation and is intended to illustrate the types of components that may be present in electronic device 10.

By way of example, the electronic device 10 may represent a block diagram of any suitable computing device, including a desktop computer, a notebook computer, a portable electronic or handheld electronic device (e.g., a wireless electronic device or smartphone), a tablet, a wearable electronic device, and other similar devices. It should be noted that the processor 12 and other related items in FIG. 1 may be generally referred to herein as "data processing circuitry." Such data processing circuitry may be embodied wholly or in part as software, software, hardware, or any combination thereof. Furthermore, the processor 12 and other related items in FIG. 1 may be a single contained processing module or may be incorporated wholly or partially within any of the other elements within the electronic device 10. For example, the processor 12 may include an application processor and/or a baseband processor. The processor 12 may be implemented with any combination of general-purpose microprocessors, microcontrollers, digital signal processors (DSPs), field programmable gate array (FPGAs), programmable logic devices (PLDs), controllers, state machines, gated logic, discrete hardware components, dedicated hardware finite state machines, or any other suitable entities that may perform calculations or other manipulations of information. The processors 12 may perform the various functions described herein and below.

In the electronic device 10 of FIG. 1, the processor 12 may be operably coupled with a memory 14 and a nonvolatile storage 16 to perform various algorithms. Such programs or instructions executed by the processor 12 may be stored in any suitable article of manufacture that includes one or more tangible, computer-readable media. The tangible, computer-readable media may include the memory 14 and/or the nonvolatile storage 16, individually or collectively, to store the instructions or routines. The memory 14 and the nonvolatile storage 16 may include any suitable articles of manufacture for storing data and executable instructions, such as random-access memory, read-only memory, rewritable flash memory, hard drives, and optical discs. In addition, programs (e.g., an operating system) encoded on such a computer program product may also include instructions that may be executed by the processor 12 to enable the electronic device 10 to provide various functionalities.

In certain embodiments, the display 18 may facilitate users to view images generated on the electronic device 10. In some embodiments, the display 18 may include a touch screen, which may facilitate user interaction with a user interface of the electronic device 10. Furthermore, it should be appreciated that, in some embodiments, the display 18 may include one or more liquid crystal displays (LCDs), light-emitting diode (LED) displays, organic light-emitting diode (OLED) displays, active-matrix organic light-emitting diode (AMOLED) displays, or some combination of these and/or other display technologies.

The input structures 22 of the electronic device 10 may enable a user to interact with the electronic device 10 (e.g., pressing a button to increase or decrease a volume level). The I/O interface 24 may enable electronic device 10 to interface with various other electronic devices, as may the network interface 26. The network interface 26 may include, for example, one or more interfaces for a personal area network (PAN), such as a BLUETOOTH® network, for a local area network (LAN) or wireless local area network (WLAN), such as a network employing one of the IEEE 802.11x family of protocols (e.g., WI-FI®), and/or for a wide area network (WAN), such as any standards related to the Third Generation Partnership Project (3GPP), including, for example, a $3^{rd}$ generation (3G) cellular network, universal mobile telecommunication system (UMTS), $4^{th}$ generation (4G) cellular network, long term evolution (LTE®) cellular network, long term evolution license assisted access (LTE-LAA) cellular network, $5^{th}$ generation (5G) cellular network, and/or New Radio (NR) cellular network. In particular, the network interface 26 may include, for example, one or more interfaces for using a Release-15 cellular communication standard of the 5G specifications that include the millimeter wave (mmWave) frequency range (e.g., 24.25-300 gigahertz (GHz)). The network interface 26 of the electronic device 10 may allow communication over the aforementioned networks (e.g., 5G, Wi-Fi, LTE-LAA, and so forth).

The network interface 26 may also include one or more interfaces for, for example, broadband fixed wireless access networks (e.g., WIMAX®), mobile broadband Wireless networks (mobile WIMAX®), asynchronous digital subscriber lines (e.g., ADSL, VDSL), digital video broadcasting-terrestrial (DVB-T®) network and its extension DVB Handheld (DVB-H®) network, ultra-wideband (UWB) network, alternating current (AC) power lines, and so forth.

As illustrated, the network interface 26 may include a transceiver 30. In some embodiments, all or portions of the transceiver 30 may be disposed within the processor 12. The transceiver 30 may support transmission and receipt of various wireless signals via one or more antennas (not shown in FIG. 1). In some cases, an impedance of the one or more antennas may disturb the duplex function and degrade isolation between the transmit path and the receive path. To prevent such disruption by the one or more antennas, a variable impedance device, such as an impedance tuner, may be used to substantially match an impedance of the antenna.

In some embodiments, the transceiver 30 may include isolation circuitry that isolates a transmitter of the transceiver 30 from reception signals and a receiver of the transceiver 30 from transmission signals. For example, the isolation circuitry may include a duplexer, such an electrical balanced duplexer (EBD), a phase balanced duplexer (PBD), and the like, that enables bidirectional communication over a single path while separating signals traveling in each direction from one another. In some embodiments, the duplexer may enable frequency division duplexing (FDD), such that the duplexer may isolate a transmitter of the electronic device 10 from a reception signal received over a first frequency band while isolating a receiver of the electronic device 10 from a transmission signal transmitted over a second frequency band (e.g., isolate the transmitter from the receiver, and vice versa). In additional or alternative embodiments, the duplexer may include multiple variable impedance devices that isolate the transmitter from a reception signal and/or isolate the receiver from a transmission signal. The duplexer may include any suitable form of a duplexer, such as the electrical balanced duplexer, the phased balanced duplexer, a double balanced duplexer, or the like.

The power source 29 of the electronic device 10 may include any suitable source of power, such as a rechargeable lithium polymer (Li-poly) battery and/or an alternating current (AC) power converter. In certain embodiments, the electronic device 10 may take the form of a computer, a portable electronic device, a wearable electronic device, or other type of electronic device.

Figure 2:
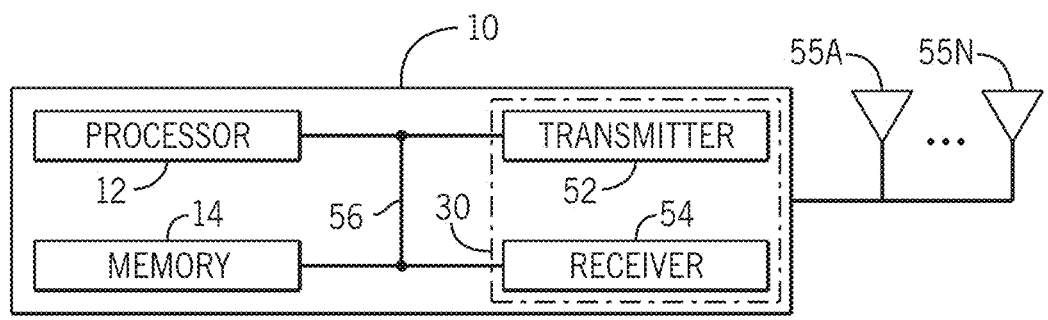
FIG. 2 is a functional block diagram of the electronic device of FIG. 1 that may implement the components shown in FIG. 1, according to embodiments of the present disclosure.

FIG. 2 is a functional block diagram of the electronic device 10 that may implement the components shown in FIG. 1, according to embodiments of the present disclosure. As illustrated, the processor 12, the memory 14, the transceiver 30, the transmitter 52, the receiver 54, and/or the antennas 55 (illustrated as 55a-55n) may be communicatively coupled directly or indirectly (e.g., through or via another component, a communication bus, a network) to one another to transmit and/or receive data between one another.

The electronic device 10 may include the transmitter 52 and/or the receiver 54 that respectively enable transmission and reception of data between the electronic device 10 and a remote location via, for example, a network or direction connection associated with the electronic device 10 and an external transceiver (e.g., in the form of a cell, eNB (E-UTRAN Node B or Evolved Node B), base stations, and the like). As illustrated, the transmitter 52 and the receiver 54 may be combined into the transceiver 30. The electronic device 10 may also have one or more antennas 55a through 55n electrically coupled to the transceiver 30. The antennas 55a-55n may be configured in an omnidirectional or directional configuration, in a single-beam, dual-beam, or multi-beam arrangement, and so on. Each antenna 55 may be associated with a one or more beams and various configurations. In some embodiments, each beam, when implement as multi-beam antennas 55, may have its own transceiver 30. The electronic device 10 may include (not shown) multiple transmitters 52, multiple receivers 54, multiple transceivers 30, and/or multiple antennas 55 as needed for various communication standards. In some embodiments, the transmitter 52 and the receiver 54 may be configured to transmit and receive information via other wired or wireline systems or means.

As illustrated, the various components of the electronic device 10 may be coupled together by a bus system 56. The bus system 56 may include a data bus, for example, as well as a power bus, a control signal bus, and a status signal bus, in addition to the data bus. The components of the electronic device 10 may be coupled together or accept or provide inputs to each other using some other mechanism.

Figure 3:
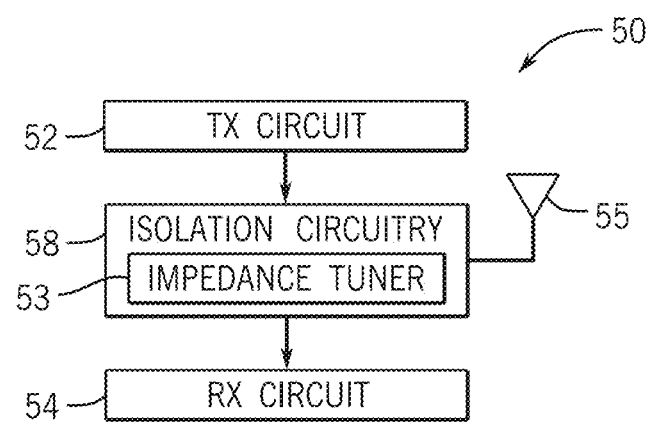
FIG. 3 is a block diagram of transceiver circuitry of the electronic device of FIG. 1, according to an embodiment of the present disclosure.

FIG. 3 is a block diagram of the transceiver circuitry 50 of the electronic device 10, according to an embodiment of the present disclosure. In some embodiments, the example transceiver circuitry 50 may be disposed in the transceiver 30 discussed with respect to FIG. 1. In other embodiments, the transceiver circuitry 50 may be disposed in the network interface 26 and coupled to the transceiver 30.

As illustrated, the transceiver circuitry 50 includes an isolation circuitry 58 disposed between a transmitter (TX) 52 (e.g., TX circuit) and a receiver (RX) 54 (e.g., RX circuit). The isolation circuitry 58 is communicatively coupled to the TX circuit 52 and the RX circuit 54. The isolation circuitry 58 may also include an impedance tuner 53. In some embodiments, the isolation circuitry 58 is coupled to one or more antennas 55. The isolation circuitry 58 enables signals (e.g., transmission signals) of a first frequency range from the TX circuit 52 to pass through to the one or more antennas 55 and blocks the signals of the first frequency range from passing through to the RX circuit 54. The isolation circuitry 58 also enables signals (e.g., reception signals) of a second frequency range received via the one or more antennas 55 to pass through to the RX circuit 54 and blocks the received signals of the second frequency range from passing through to the TX circuit 52. Each frequency range may be of any suitable bandwidth greater than about 10 MHZ, such as between 1 and 100 gigahertz (GHz) (e.g., 10 megahertz (MHz)), and include any suitable frequencies. For example, the first frequency range (e.g., the TX frequency range) may be between 880 and 890 MHz, and the second frequency range (e.g., the RX frequency range) may be between 925 and 936 MHz.

In some embodiments, the isolation circuitry 58 isolates the RX circuit 54 from a transmission signal (e.g., a TX signal) generated by the TX circuit 52. For example, when transmitting the TX signal, some of the TX signal (e.g., a TX leakage signal) may propagate toward the RX circuit 54. If a frequency of the TX leakage signal is within the RX frequency range (e.g., is a frequency supported by the RX circuit 54), the TX leakage signal may interfere with a reception signal (e.g., an RX signal) and/or the RX circuit 54. To prevent such interference, the isolation circuitry 58 may isolate the RX circuit 54 from the TX leakage signal. In particular, the processor 12 (e.g., of FIG. 2) may determine the antenna impedance based on a measured antenna impedance, calculated antenna impedance, or estimated antenna impedance, and tune the impedance tuner 53 of the isolation circuitry 58 to match or approximately match the antenna impedance.

In additional or alternative embodiments, the isolation circuitry 58 isolates the TX circuit 52 from the RX signal received via the one or more antennas 55. For example, when receiving the RX signal from the one or more antennas 55, some of the RX signal (e.g., an RX leakage signal) may propagate toward the TX circuit 52. If a frequency of the RX leakage signal is within the TX frequency range (e.g., is a frequency supported by the TX circuit 52), the RX leakage signal may interfere with the TX signal and/or the TX circuit 52. To prevent such interference, the isolation circuitry 58 may isolate the TX circuit 52 from the RX leakage signal, such as by tuning the impedance tuner 53 to match the antenna impedance.

Figure 4:
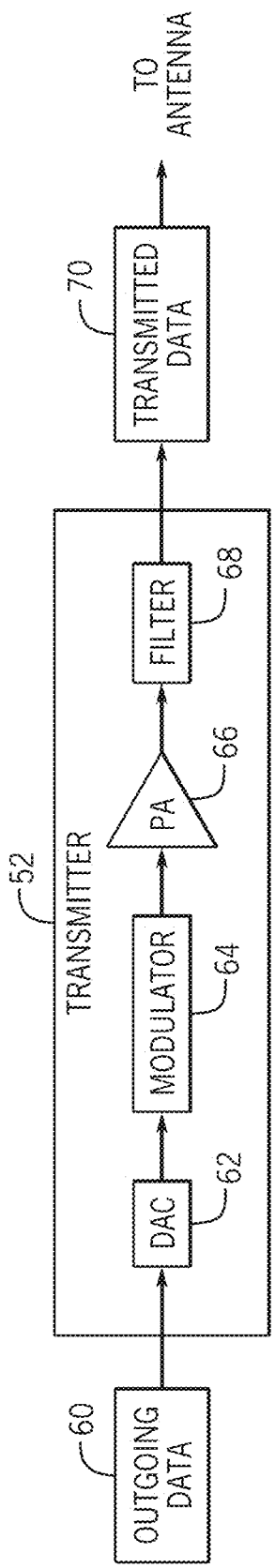
FIG. 4 is a schematic diagram of a transmitter circuit of the transceiver circuitry of FIG. 3, according to an embodiment of the present disclosure.

FIG. 4 is a schematic diagram of the transmitter 52 (e.g., TX circuit 52), according to embodiments of the present disclosure. As illustrated, the transmitter 52 may receive outgoing data 60 in the form of a digital signal to be transmitted via the one or more antennas 55. A digital-to-analog converter (DAC) 62 of the transmitter 52 may convert the digital signal to an analog signal, and a modulator 64 may combine the converted analog signal with a carrier signal to generate a radio wave. A power amplifier (PA) 66 may receive the modulated signal from the modulator 64. The PA 66 may amplify the modulated signal to a suitable level to drive transmission of the signal via the antennas 55.

A filter 68 (e.g., filter circuitry and/or software) of the transmitter 52 may then remove undesirable noise from the amplified signal to generate transmitted data 70 to be transmitted via the antennas 55. The filter 68 may include any suitable filter or filters to remove the undesirable noise from the amplified signal, such as a bandpass filter, a bandstop filter, a low pass filter, a high pass filter, and/or a decimation filter. Additionally, the transmitter 52 may include any suitable additional components, such that the transmitter 52 may transmit the outgoing data 60 via the antennas 55. For example, the transmitter 52 may include a mixer and/or a digital up converter. As another example, the transmitter 52 may not include the filter 68 if the power amplifier 66 outputs the amplified signal in or approximately in a desired frequency range (such that filtering of the amplified signal may be unnecessary).

Figure 5:
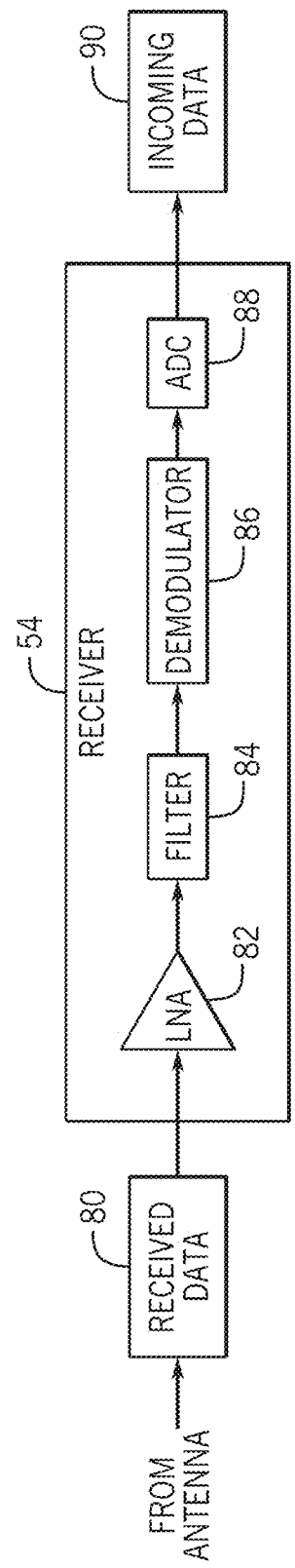
FIG. 5 is a schematic diagram of a receiver circuit of the transceiver circuitry of FIG. 3, according to an embodiment of the present disclosure.

FIG. 5 is a schematic diagram of the receiver 54 (e.g., RX circuit 54), according to embodiments of the present disclosure. As illustrated, the receiver 54 may receive received data 80 from the one or more antennas 55 in the form of an analog signal. A low noise amplifier (LNA) 82 may amplify the received analog signal to a suitable level for the receiver 54 to process. A filter 84 (e.g., filter circuitry and/or software) may remove undesired noise, such as cross-channel interference, from the received signal. The filter 84 may also remove additional signals received by the antennas 55 that are at frequencies other than the desired signal. The filter 84 may include any suitable filter or filters to remove the undesired noise or signals from the received signal, such as a bandpass filter, a bandstop filter, a low pass filter, a high pass filter, and/or a decimation filter. A demodulator 86 may remove a radio frequency envelope and/or extract a demodulated signal from the filtered signal for processing. An analog-to-digital converter (ADC) 88 may receive the demodulated analog signal and convert the signal to a digital signal of incoming data 90 to be further processed by the electronic device 10. Additionally, the receiver 54 may include any suitable additional components not shown, or may not include certain of the illustrated components, such that the receiver 54 may receive the received data 80 via the one or more antennas 55. For example, the receiver 54 may include a mixer and/or a digital down converter.

Figure 6:
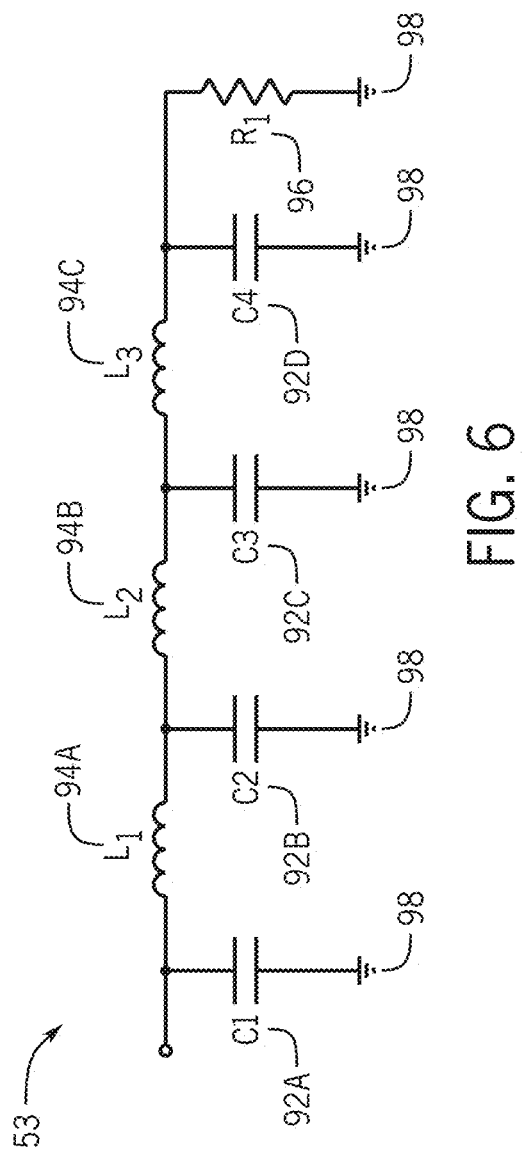
FIG. 6 is a schematic diagram of an impedance tuner of the transceiver circuitry of FIG. 3, according to an embodiment of the present disclosure.

FIG. 6 is a schematic diagram of an impedance tuner 53 of the transceiver circuitry 50 of FIG. 3, according to an embodiment of the present disclosure. The impedance tuner 53 may be disposed between the antenna 55 and the transmitter 52 and/or the receiver 54 of FIG. 3. Generally, the impedance tuner 53 may vary an input impedance (e.g., load impedance) to efficiently transfer and/or increase power over a frequency (e.g., frequency range) by matching the antenna impedance of the antenna 55 (e.g., source impedance) at the antenna. As shown, a circuit of the impedance tuner 53 may include a first capacitor 92A ($C_1$), a second capacitor 92B ($C_2$), a third capacitor 92C ($C_3$), and a fourth capacitor 92D ($C_3$). The impedance tuner 53 may include a first inductor 94A ($L_1$), a second inductor 94B ($L_2$), and third inductor 94C ($L_3$). Moreover, the impedance tuner 53 may also include a resistor 96 ($R_1$). As shown, the capacitors 92 and the resistor 96 may couple to ground 98. Although the following descriptions describe the circuit of the impedance tuner 53 as including four capacitors 92, three inductors 94, and one resistor 96, the impedance tuner 53 may include any suitable number of capacitors 92, inductors 94, and/or resistors 96 (e.g., zero, one, three, five, eight, and so forth).

As will be described herein, the processor 12 may determine whether isolation between the transmitter 52 and the receiver 54 is sufficient based on transmitter leakage of the transmitter 52 and receiver leakage of the receiver 54. If the processor 12 determines that the isolation is not sufficient (e.g., based on a threshold transmitter leakage and/or a threshold receiver leakage that corresponds to a threshold isolation), the processor 12 may determine an antenna impedance (e.g., by measuring, calculating, estimating, and so forth), as will be discussed in detail with respect to FIGS. 8, 11, 12, and 13. The processor 12 may determine impedance tuner settings for the impedance tuner 53 based on the antenna impedance for a frequency or frequency range (e.g., for the transmitter 52 or the receiver 54).

In particular, the processor 12 may vary the values of tunable capacitors 92, tunable inductors 94, and/or tunable resistors 96 to provide an impedance (e.g., for a transmitter output or a receiver input) at the impedance tuner 53 that matches or approximately matches the antenna impedance. The processor 12 may retune the impedance tuner 53 periodically and/or based on a presence of one or more factors, for example, that may change the antenna impedance (e.g., environmental conditions, operating frequency, and so forth). By tuning the impedance tuner 53 to match the antenna impedance of the antenna 55, the transceiver 30 may reduce or prevent voltage or current loss of the transmitter 52 (e.g., transmitter leakage) that may otherwise reflect back into the transceiver 30, so that the transceiver 30 may transmit the transmission signals over a frequency at the intended power level (e.g., maximum power level). Similarly, the transceiver 30 may reduce or prevent voltage or current loss of the receiver 54 (e.g., receiver leakage) by tuning the impedance tuner 53 so that the transceiver 30 may receive the reception signals over a frequency at the intended power level.

Figure 7:
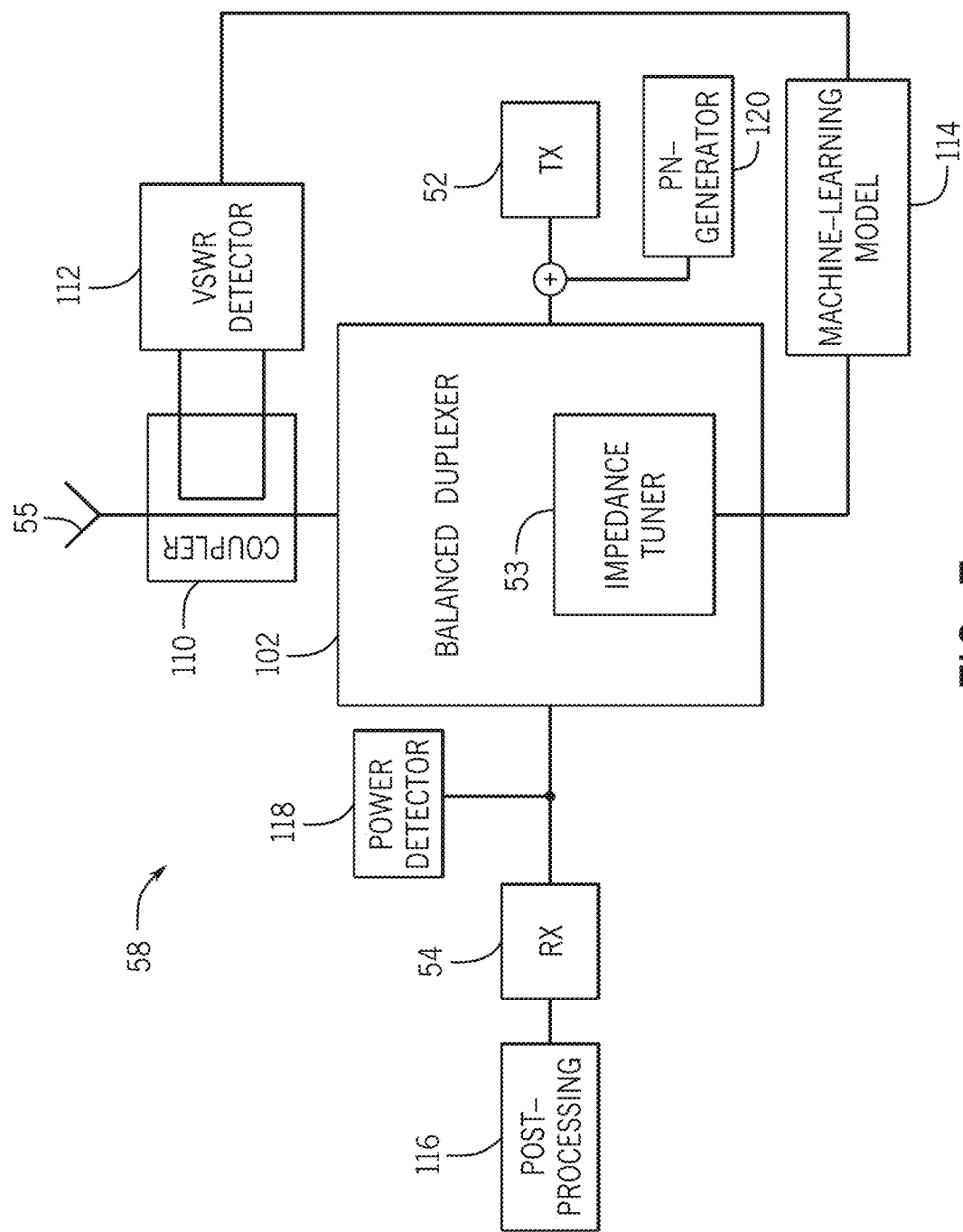
FIG. 7 is a schematic diagram of isolation circuitry of the transceiver circuitry of FIG. 3 that includes a voltage standing wave radio (VSWR) detector, according to an embodiment of the present disclosure.

FIG. 7 is a schematic diagram of the isolation circuitry 58 including a voltage standing wave radio (VSWR) detector 112, according to an embodiment of the present disclosure. As shown, the isolation circuitry 58 may include a duplexer 102 (e.g., a balanced duplexer system) that is integrated with or coupled to an impedance tuner 53 and an antenna 55, a transmitter 52 and a receiver 54. These components may function as previously described with respect to FIGS. 3-6. The duplexer 102 is also coupled to a coupler 110, a machine-learning model 114, a post-processing unit 116, a power detector 118, and a pseudo-noise (PN) generator 120. In the depicted embodiment, the isolation circuitry 58 includes at least one device, the VSWR detector 112, for determining the antenna impedance. In some embodiments, and as will be discussed with respect to FIG. 8, the machine-learning model 114 may communicate with and/or be integrated with the processor 12.

The coupler 110 is coupled to the antenna 55 and couples a portion of a signal, including a transmission signal that is transmitting towards the antenna 55 or a reception signal that is received at the antenna 55, to the VSWR detector 112. The VSWR detector 112 measures or otherwise determines the antenna impedance of the portion of the transmission signal on a transmitting frequency and/or the portion of the reception signal on a receiving frequency.

In particular, the VSWR detector 112 measures a standing wave ratio (SWR) in a transmission line or path of the transmitter 52 or the degree of mismatch between the transmission line and the antenna 55, and/or a reception line or path of the receiver 54 or the degree of mismatch between the reception line and the antenna 55. The VSWR detector 112 measures the magnitude of forward and reflected waves of the transmission signal and/or the reception signal (e.g., coupled out by the coupler 110) to calculate the SWR. The processor 12 or the VSWR detector 12 may determine the measured antenna impedance based on the SWR. The VSWR detector 12 sends the measured impedance to the machine-learning model 114. The machine-learning model 114 includes one or more statistical models or a combination of the statistical models (e.g., linear regression, logistic regression, decision tree, and so forth). The machine-learning model may be trained with data that provides the matching or approximately matching tuner impedance for a determined antenna impedance for a frequency. The machine-learning model 114 may provide or the processor 12 may determine the impedance tuner settings based on the matching tuner impedance, including the values of the capacitors 92, inductors 94, and/or resistor 96 of the impedance tuner 53, as discussed with respect to FIG. 6.

Additionally, the isolation circuitry 58 may measure the transmitter leakage of the transmitter 52 and the receiver leakage of the receiver 54. As will be discussed in detail with respect to FIGS. 8-14, the transmitter leakage and the receiver leakage may correspond to a level of isolation. As such, the processor 12 may determine whether a measured transmitter leakage during transmission and/or a measured receiver leakage during reception is above a respective transmitter leakage threshold and/or a receiver leakage threshold (e.g., too much leakage). The transmitter leakage threshold and the receiver leakage threshold may be any predetermined suitable power level that facilitates transmitting the transmission signal and receiving the reception signal with a threshold level of communication quality. By way of example, the transmitter leakage threshold and receiver leakage threshold may be approximately 55 decibels (dB) (e.g., 50 dB, 55 dB, 60 dB, and so forth).

To determine the receiver leakage, the isolation circuitry 58 may use the post-processing unit 116 (which may be communicatively coupled to or integrated with the processor 12). To determine the transmitter leakage, the isolation circuitry 58 may use the power detector 118. For determining the receiver leakage using the post-processing unit 116, the PN generator 120 may inject a PN signal (e.g., a tone or noise) after the transmitter 52 (e.g., at the transmission line) at an input power level. The PN signal may transmit through the duplexer 102. The post-processing unit 116 may determine the power level (e.g., an output power level) of the PN signal after it progresses through the receiver 54 in the isolation circuitry 58, and determine the receiver leakage by taking the difference between the output power level (e.g., after the PN signal has traveled through the receiver 54) and the input power level (e.g., before the PN signal has traveled through the receiver 54).

To determine the transmitter leakage, the power detector 118 may measure the power of the transmission signal from the transmitter 52 prior to the receiver 54 receiving the transmission signal. In general, the power detector 118 may measure or detect power of a radio frequency signal, such as the transmission signal. The power detector 118 may output a direct current (DC) output voltage that is proportional to the power of the radio frequency signal detected at an input of the power detector 118. Specifically, the PA 66 of the transmitter 52 may amplify the transmission signal to an input power level, and the processor 12 may determine the transmitter leakage by determining a power difference between the amplified transmission signal and the power of the transmission signal received and measured at the power detector 118 (e.g., an output power level). If the transmitter and the receiver leakages are above leakage thresholds, the processor 12 may determine that the transmitter 52 and the receiver 54 are not sufficiently isolated and thus (e.g., too much leakage), the processor 12 may tune the impedance of the impedance tuner 53 to match or approximately match the measured antenna impedance.

Figure 8:
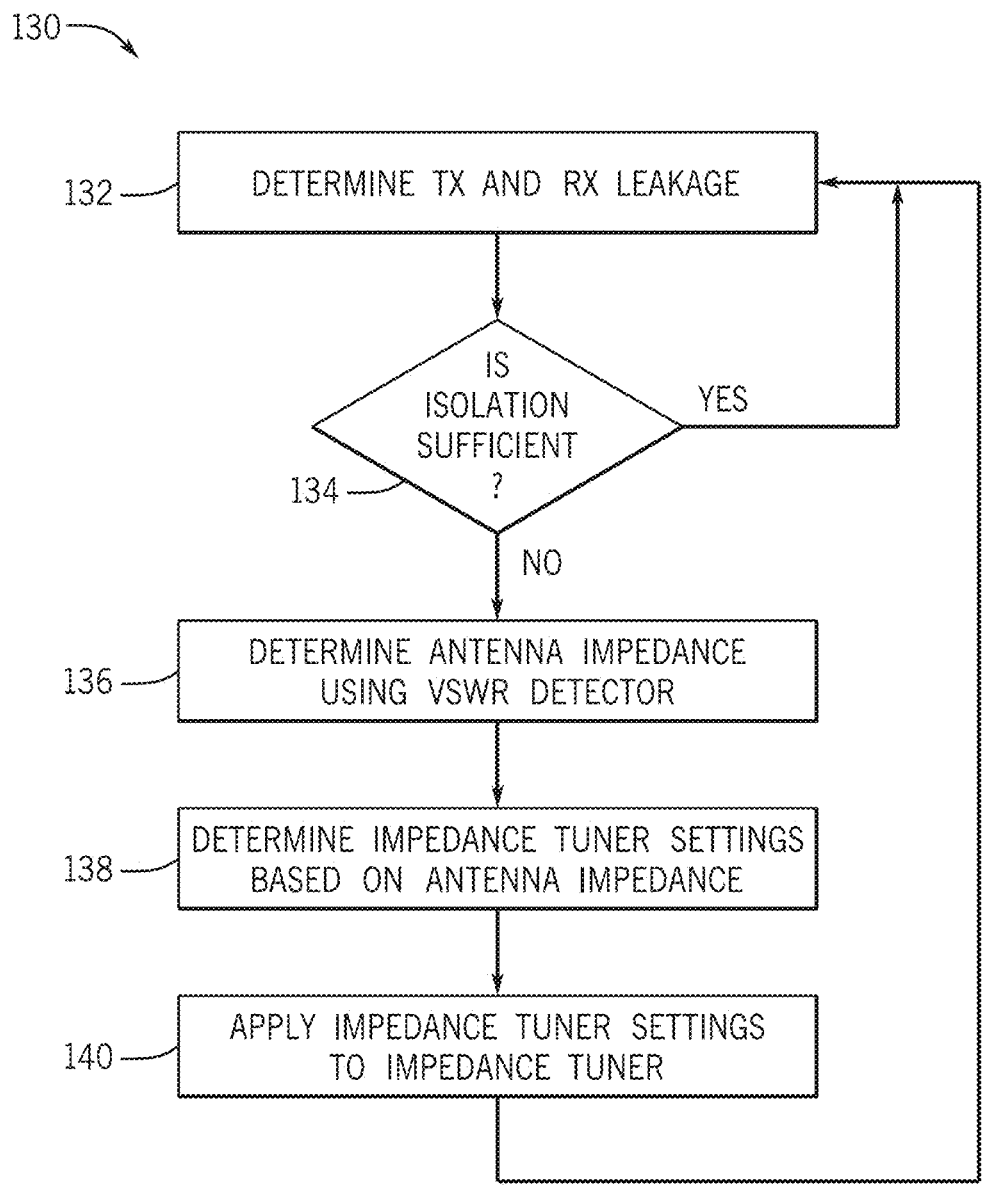
FIG. 8 is a process flow diagram for determining antenna impedance using the VSWR detector of FIG. 7, according to an embodiment of the present disclosure.

To illustrate, FIG. 8 is a process flow diagram of a method 130 for determining the antenna impedance using the VSWR detector 112 of FIG. 7, according to an embodiment of the present disclosure. Any suitable device that may control the electronic device 10 and/or the isolation circuitry 58, such as the processor 12 (e.g., one or more processors), may perform the method 130. The processor 12 may also perform the methods described with respect to other processes described herein, such as the processes of FIGS. 11, 12, and 14. In some embodiments, the method 130 may be implemented by executing instructions stored in a tangible, non-transitory, computer-readable medium, such as the memory 14 (e.g., one or more memory devices), using the processors 12. The processor 12 of the electronic device 10 may execute instructions to perform the method 130 that are stored in the memory 14 and carried out by the processor 12. While the method 130 is described using steps in a specific sequence, it should be understood that the present disclosure contemplates that the described steps may be performed in different sequences than the sequence illustrated, and certain described steps may be skipped or not performed altogether.

As shown, at process block 132, the processor 12 may determine the transmitter leakage of the transmitter 52 and the receiver leakage of the receiver 54. In particular, the processor 12 may determine the transmitter and receiver leakages for the transmission signals and the reception signals communicated over a particular frequency, using the post-processing unit 116 or the power detector 118, as discussed with respect to FIG. 7. That is, the processor 12 may determine the receiver leakage based on the PN signal received by the post-processing unit 116 and the transmitter leakage based on the power output determined by the power detector 118.

After determining the transmitter and receiver leakages, at decision block 134, the processor 12 may determine if the isolation between the transmitter 52 and the receiver 54 is sufficient based on the determined transmitter and receiver leakages. Specifically, the processor 12 may determine if the determined transmitter leakage is above a predetermined transmitter leakage threshold and/or the determined receiver leakage is above a predetermined receiver leakage threshold. In some embodiments, the leakage threshold may be dynamic and vary for each frequency or range of frequencies. As previously mentioned, the threshold transmitter and receiver leakages may be any predetermined suitable power level that facilitates transmitting the transmission signal and receiving the reception signal with a threshold level of communication quality, indicating sufficient isolation. As an example, the threshold transmitter and receiver leakages may be approximately 55 dB, such that the transmitter and the receiver 54 may not be sufficiently isolated when the isolation falls below 55 dB (e.g., the transmitter and receiver leakages are above the threshold).

If the transmitter 52 and receiver 54 are sufficiently isolated based on the transmitter and receiver leakages being above the threshold, the processor 12 may continue determining (e.g., looping) the transmitter and receiver leakages (e.g., process block 132). In some embodiments, the processor 12 may loop and periodically (e.g., after a predetermined time period) determine the transmitter and receiver leakages. In some embodiments, the processor 12 may repeat determining the transmitter and receiver leakages based on a presence of one or more factors that may affect antenna performance and/or that may affect isolation between the transmitter 52 and the receiver 54. For example, the factors may include a change to the frequency (e.g., same frequency or range of frequencies used for transmitting and receiving), environmental conditions, and so forth.

If the transmitter 52 and receiver 54 are not sufficiently isolated based on the transmitter and receiver leakages being above the threshold (e.g., isolation is below 55 dB), at process block 136, the processor 12 may determine the antenna impedance using the VSWR detector 112. In particular, the processor 12 may determine the antenna impedance as described with respect to FIG. 7. That is, the processor 12 may determine the antenna impedance for a first frequency and a second frequency, in which the antennas 55 transmit the transmissions signals over the first frequency and the reception signals over the second frequency, based on received SWR or impedance from the VSWR detector 112. In some embodiments, the VSWR detector 112 may determine the antenna impedance and send an indication of the antenna impedance to the processor 12 and/or the machine-learning model 114. Subsequently, the processor 12 may determine matching impedances of the transmitter 52 and receiver 54.

In particular, at block 138, the processor 12 may determine the impedance tuner settings based on the impedances of the transmitter 52 and receiver 54. The processor 12 may send the antenna impedance to the machine-learning model 114, as described with respect to FIG. 7. The machine-learning model 114 may be trained with capacitive inputs and receive impedance outputs at each of the transmitter and the receiver frequencies (e.g., training data).

To generate the training data, the machine-learning model 114 may determine a sufficient matching at the first frequency for transmitting the transmission signal and the second frequency for receiving the reception signal. The training data may be generated during simulation (e.g., design phase prior to production) or during production (e.g., manufacturing of the electronic device 10). Sufficient matching may refer to input values (e.g., impedance tuner settings), such as the values of the capacitors 92, inductors 94, and/or the resistor 96, to the output resulting impedance, within a threshold. For example, if the training data includes a capacitive input of X to result in an impedance output of Y, and the input of the capacitive input of X and the actual impedance output is off from the output Y by greater than the threshold, then the capacitive input and resulting output combination may not meet the sufficient matching. If any combination of capacitive inputs and impedance outputs do not result in sufficient matching, the combination may be removed as an option of impedance tuner setting. Thus, combinations with a certain sufficient matching may remain as options. In some embodiments, the difference between transmitter 52 and the receiver 54 matching may be irrelevant since the matching is sufficient in both frequency bands for proper operation at high isolations (e.g., above 55 dB). Moreover, determining the sufficient matching may be performed for each of the transmitter 52 and receiver 54 separately. The training data may include impedance tuner settings that provide wide-band cancellation of antenna mismatch.

As previously mentioned, the machine-learning model 114 may be trained with data that provides the matching or approximately matching respective tuner impedance outputs for the determined antenna impedance for the frequency. The processor 12 may determine the impedance tuner settings corresponding to the matching impedance including the values of the capacitors 92, inductors 94, and/or resistor 96 of the impedance tuner 53. Additionally or alternatively, the machine-learning model 114 may be integrated with the processor 12, determine the antenna impedance and provide the impedance tuner settings. At process block 140, the processor 12 may apply the impedance tuner settings to the impedance tuner 53. That is, the processor 12 may adjust (e.g., tune) the values of the capacitors 92, the inductors 94, and/or the resistor 96 based on the impedance tuner settings.

Figure 9:
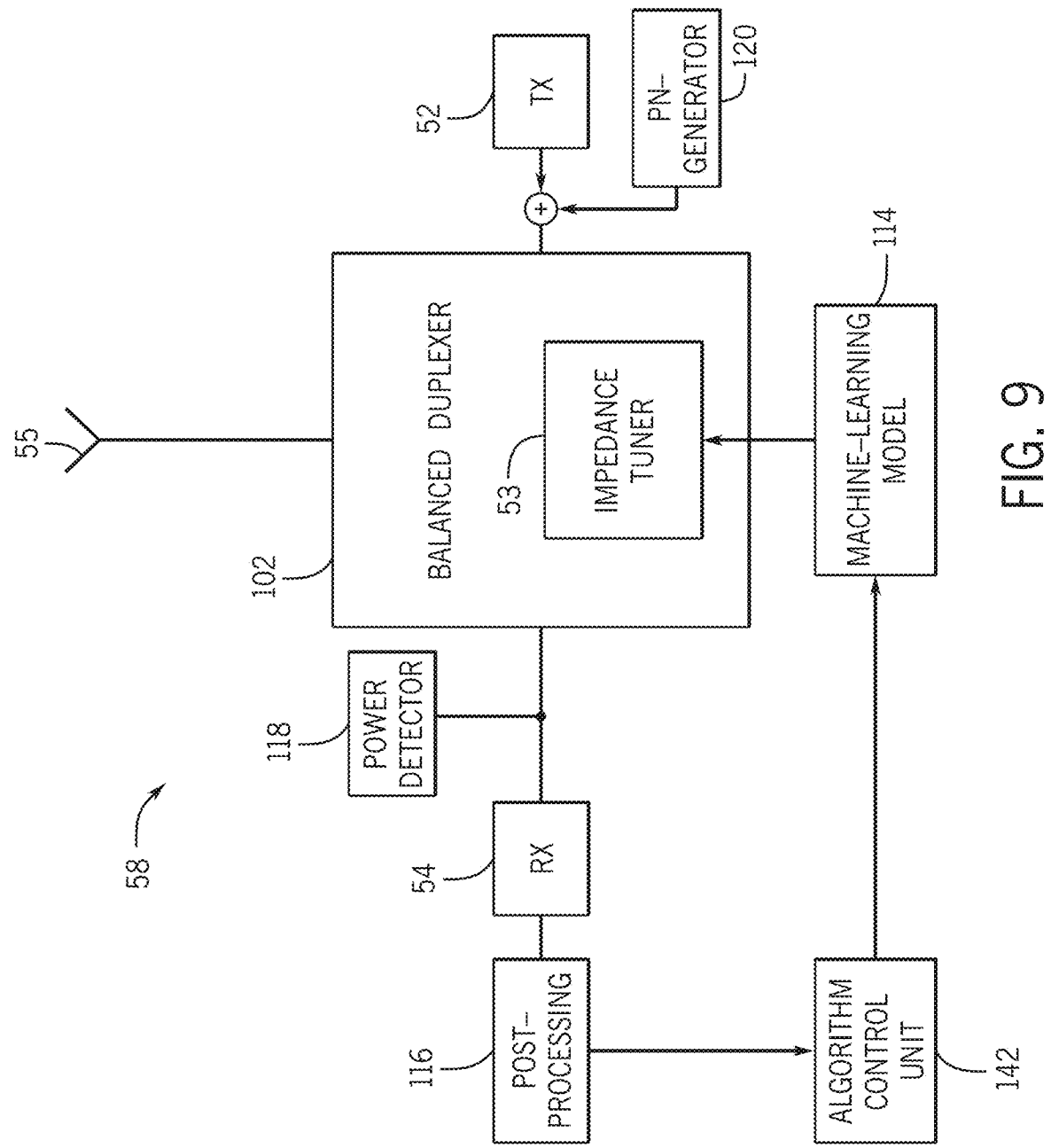
FIG. 9 is a schematic diagram of the isolation circuitry of the transceiver circuitry of FIG. 3 that estimates antenna impedance using leakage measured for multiple impedance tuner test settings without the VSWR detector, according to an embodiment of the present disclosure.

FIG. 9 is a schematic diagram of the isolation circuitry 58 that estimates antenna impedance using leakage measured for multiple impedance tuner test settings without the VSWR detector 112 and the coupler 110, according to an embodiment of the present disclosure. That is, FIG. 9 depicts the isolation circuitry 12 without a device for measuring the antenna impedance of the antenna 55. As shown, the isolation circuitry 58 may include the duplexer 102 that is integrated with or coupled to the impedance tuner 53 and the antenna 55, the transmitter 52, and the receiver 54. The duplexer 102 may be coupled the machine-learning model 114, the post-processing unit 116, the power detector 118, the PN generator 120, and an algorithm control unit (ACU) 142. The duplexer 102, the impedance tuner 53, the antenna 55, the transmitter 52, the receiver 54, the machine-learning model 114, the post-processing unit 116, the power detector 118, and the PN generator 120, may function as described with respect to FIG. 7. In particular, the isolation circuitry 58 may measure the transmitter leakage and/or the receiver leakage using the post-processing unit 116 or the power detector 118, respectively.

In the current embodiment, and as will be discussed herein, the processor 12 may indirectly determine the antenna impedance since the isolation circuitry 58 does not include a device that may directly measure or calculate the antenna impedance. The ACU 142 and/or the machine-learning model 114 may communicate with or be integrated with the processor 12. The ACU 142 may process one or more algorithms (e.g., optimization algorithms) to determine the antenna impedance and/or the impedance tuner settings based on the determined transmitter and/or receiver leakages. As shown, the post processing unit 116 may be communicatively coupled with the ACU 142, which may be communicatively coupled with the machine-learning model 114. As will be discussed in detail with respect to FIG. 11, the ACU 142 may perform test tuning using multiple test impedance tuner settings. The ACU may provide information related to the tuning states to the machine-learning model 114, which may determine the matching tuner impedance and/or the tuner impedance settings, as described with respect to FIG. 7.

Figure 10:
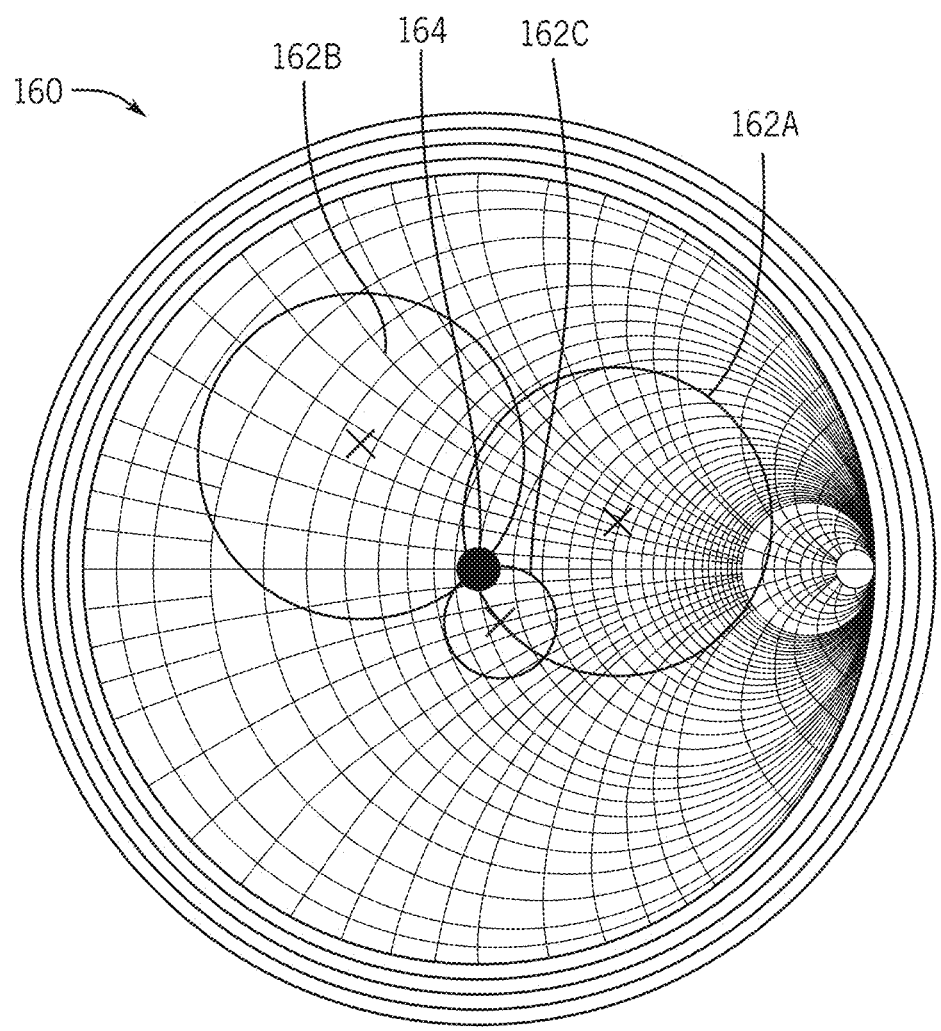
FIG. 10 is a block diagram of a Smith chart of leakage measured for multiple impedance tuner test settings using the isolation circuitry of FIG. 9, according to an embodiment of the present disclosure.

To illustrate how the test tuning of the impedance tuner 53 is performed, FIG. 10 is a block diagram of a Smith chart 160 of leakages measured for multiple impedance tuner test settings, according to an embodiment of the present disclosure. The Smith chart 160 includes a first test leakage 162A, a second test leakage 162B, and a third test leakage 162C of the transmitter 52 or the receiver 54. Each of the test leakages 162 (e.g., 162A, 162B, 162C) may correspond to a test impedance tuner setting (e.g., a first impedance tuner setting, a second impedance tuner setting, a third impedance tuner setting, respectively) for transmitting the transmission signals and receiving the reception signals at a frequency. Generally, the test leakage 162 is proportional to antenna mismatch (e.g., larger circle corresponds to higher leakage). As will be discussed with respect to FIG. 11, the processor 12 and/or the ACU 142 may calculate the antenna impedance using the test leakages 162. Generally, the Smith chart 160 may represent each of the test leakages as a test reflection coefficient. For example, a test leakage may correspond to a portion of a transmission signal reflected back to the transceiver 30 (e.g., to the receiver 54) and a portion of a reception signal reflected back to the transceiver 30 (e.g., to the transmitter 52). The test leakages correspond to how far test reflection coefficients (e.g., indicated by an X symbol) are on the Smith chart 160 from an antenna reflection coefficient of the antenna 55 having an antenna impedance. Thus, a distance between a test reflection coefficient from the antenna reflection coefficient and a matching impedance may be directly correlated. That is, the closer a particular test reflection coefficient and the antenna reflection coefficient are on the Smith chart 160 (e.g., shorter distance), the closer the impedance of the particular test reflection coefficient will match the antenna impedance of the antenna 55. The antenna reflection coefficient and target matching impedance may be measured or calculated at an intersection 164 of the test leakages 162.

Figure 11:
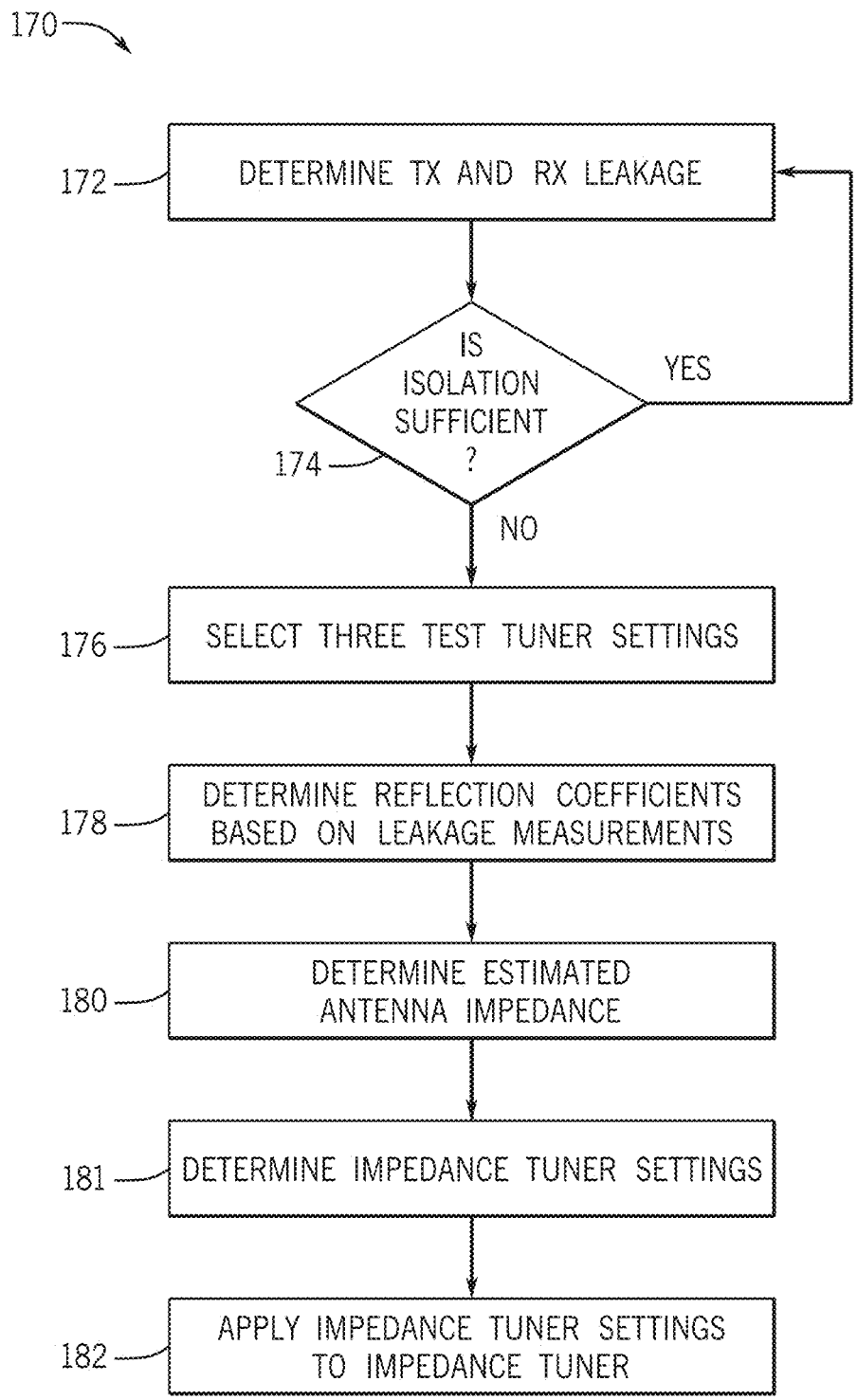
FIG. 11 is a process flow diagram for estimating the antenna impedance using leakage measured for the multiple impedance tuner test settings, according to an embodiment of the present disclosure.

FIG. 11 is a process flow diagram of a method 170 for estimating the antenna impedance using leakage measured for the multiple impedance tuner test settings, according to an embodiment of the present disclosure. At process block 172, the processor 12 may measure the transmitter leakage and receiver leakage, as discussed with respect to block 132. At decision block 174, the processor 12, may determine if the isolation between the transmitter 52 and the receiver 54 is sufficient, as discussed with respect to decision block 134 of FIG. 8.

At process block 176, the processor 12 (e.g., using the ACU 142) may select three test impedance tuner settings for transmitting the test transmission signals over a transmission frequency and receiving the test reception signals over receive frequency. Specifically, the processor 12 may select the test impedance tuner settings and perform process block 178 to determine the transmitter leakage of the transmitter 52 sending the test transmission signals using the test impedance tuner settings over the transmission frequency. The processor 12 may repeat the process for the receiver 54 to determine the receiver leakage over the receive frequency. The ACU 142 may arbitrarily select a first test tuner impedance setting of the impedance tuner 53 for transmitting a first test transmission signal and receiving a first test reception signal. Similarly, the ACU 142 may subsequently and arbitrarily select a second test tuner impedance setting (different from the first test tuner impedance setting) for transmitting a second test transmission signal and receiving a second test reception signal. After sending the second test transmission signal and receiving the second test reception signal, the ACU may arbitrarily select a third test tuner impedance setting (different from the first and second test tuner impedance settings) for transmitting a third test transmission signal and receiving a third test reception signal.

In particular, the processor 12 may send the selected test tuner impedance settings to the machine-learning model 114, as shown with respect to FIG. 9. The machine-learning model 114 may determine the impedance tuner settings of the impedance tuner 53 based on the test tuner impedance settings determined by the ACU 142 and the processor 12 may adjust the impedance tuner 53 based on the impedance tuner settings. For example, the machine-learning model 114 may determine the impedance tuner setting for the impedance tuner 53 at the target frequency, such as capacitors 92 and inductors 94 values. The transmitter 52 may transmit the test transmission signals (e.g., one at a time). Additionally, the PN generator 120 may send the PN signal. The post processing unit 116 and/or the power detector 118 may determine the transmitter leakages (e.g., one at a time) for each of the test impedance tuner settings, as discussed with respect to FIG. 7 and FIG. 8. The processor 12 may repeat the processes for the receiver 54.

At process block 178, the processor 12 may perform one or more algorithms to determine the test reflection coefficients ($\Gamma_{IT}(\omega)$) based on the transmitter and receiver leakages. That is, the processor 12 may determine three test reflection coefficients for test transmission and reception signals. Based on the three test reflection coefficients, at process block 180, the processor 12 may determine an estimated antenna impedance at the target frequency. In particular, the processor 12 may determine the antenna impedance based on the following equation:

$$ISO_{TX-RX}(dB) = 20 \log_{10}|\Gamma_{IT}(\omega) - \Gamma_{IT}(\omega)|)$$ (Equation 1)

The processor 12 estimates the antenna impedance based on three sets of the equations for the transmitter and receiver leakages (e.g., six equations total), corresponding to the three test reflection coefficients for a target frequency. As previously mentioned, the antenna impedance may correspond to an intersection 164 of the three test reflection coefficients on the Smith chart 160 of FIG. 10. In some embodiments, the processor 12 may repeat process blocks 176 and 178 for a different target frequency, such as a frequency for receiving the reception signals at the receiver 54.

At process block 181, the processor 12 may determine the impedance tuner settings based on the estimated antenna impedance. That is, using the three equations to solve for the antenna impedance of the antenna 55 may provide a near exact or exact antenna impedance (e.g., estimated antenna impedance). The processor 12 may determine a matching impedance of the estimated antenna impedance and the impedance tuner settings, including the values of the capacitors 92, inductors 94, and/or resistor 96 the impedance tuner 53. At process block 182, the processor 12 may apply the impedance tuner settings to the impedance tuner 53, as discussed with respect to process block 140 of FIG. 8.

Figure 12:
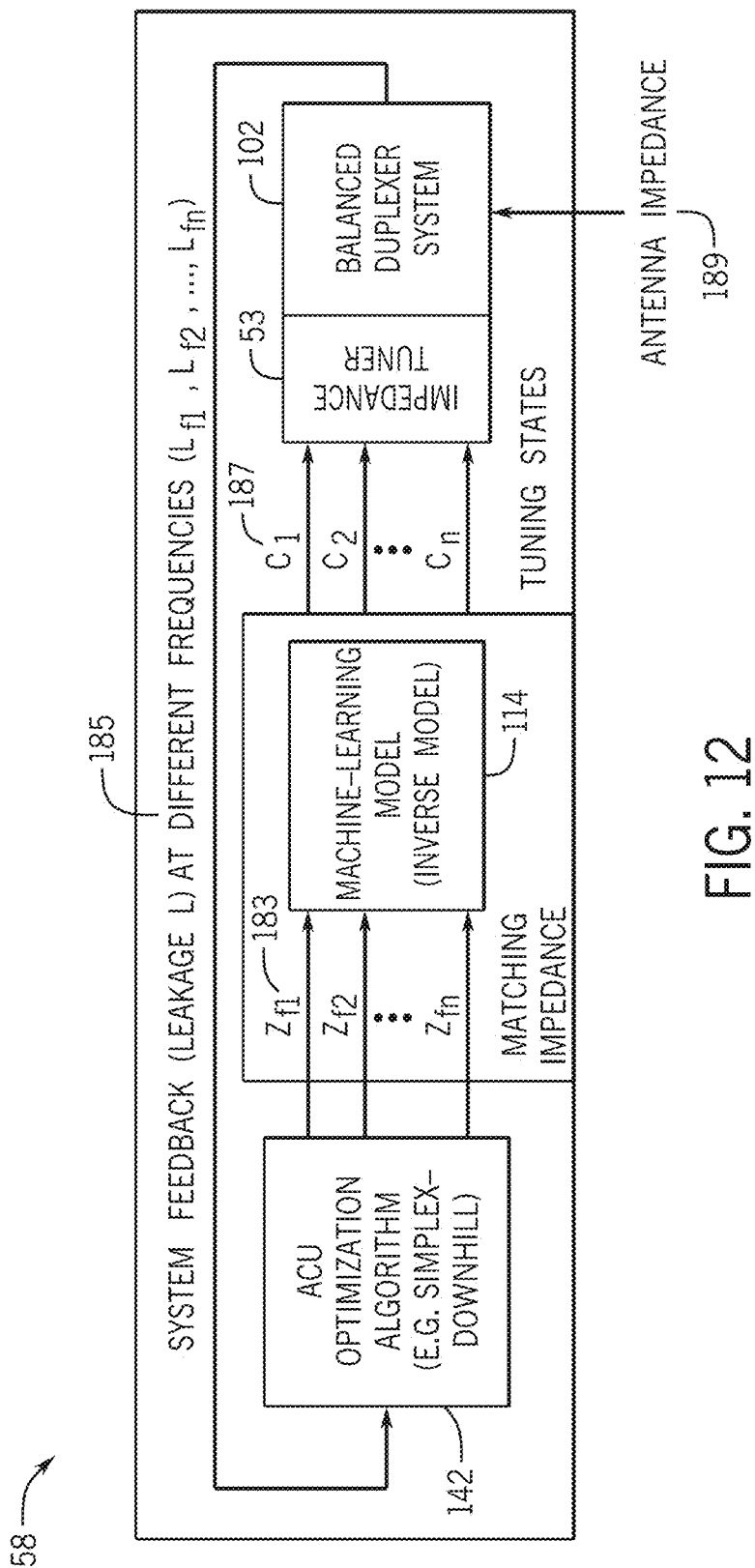
FIG. 12 is a flow diagram of the isolation circuitry of the transceiver circuitry of FIG. 3 that determines impedance tuner settings using an inverse machine-learning model, according to an embodiment of the present disclosure.

FIG. 12 is a flow diagram of isolation circuitry 58 that determines the impedance tuner settings of the impedance tuner 53 of the duplexer 102 using an inverse model of the machine-learning model 114, according to an embodiment of the present disclosure. The flow diagram may apply to the isolation circuitry 58 (e.g., that does not have the VSWR detector 112 or the coupler 110) of FIG. 9. As will be discussed in detail with respect to FIG. 13, the processor 12 may use the inverse model on a received matching impedance and provide the corresponding impedance tuner settings, such as the values of the capacitors 92, to output the matching impedance. Although the following descriptions describe the machine-learning model 114 providing impedance tuner settings including values of capacitors 92, which represents a particular embodiment, the machine-learning model 114 may additionally or alternatively provide values of inductors 94 and/or the resistor 96 corresponding to a matching impedance.

The processor 12 may receive the transmitter and receiver leakages 185 for transmitting the transmission signals and receiving the reception signals over one or more frequencies (e.g., leakage at a first frequency ($L_{f1}$), leakage at a second frequency ($L_{f2}$), and so forth, to $L_{fN}$). For example, the processor 12 may determine the transmitter and receiver leakages 185 as discussed with respect to block 132 of FIG. 8. The processor 12 (e.g., via the ACU 142) may process one or more algorithms to determine the matching impedance 183 based on the transmitter and receiver leakages 185 to match the antenna impedance 189. That is, rather than determining test impedance tuner settings, test reflection coefficients, and the antenna reflection coefficient, the processor 12 may directly process the transmitter and receiver leakages 185 as inputs of one or more algorithms to output the matching impedances 183 (e.g., $Z_{f1}$ to $Z_{fN}$) at each of the respective frequencies (e.g., $\omega_1$ to $\omega_N$).

The ACU 142 may determine the output matching impedances based on previously measured or determined antenna impedances 189 for the particular transmitter and receiver leakage 185 at the particular frequency. That is, the ACU 142 determines values for the matching impedance 183 that reduces or minimizes the transmitter and the receiver leakage 185 at the particular frequency. The ACU 142 may incrementally or iteratively determine and output the matching impedance 183 (e.g., for retuning the impedance tuner 53) that matches or approximately matches the antenna impedance 189 since the antenna impedance 189 may change often (e.g., as the electronic device 10 moves and environmental factors affect performance of antenna 55). The one or more algorithms may include any algorithm that optimizes matching the impedance tuner impedance to the antenna impedance, such as the downhill simplex method, the gradient descent method, the Nelder-Mead method, the amoeba method, the polytope method, or any other method related to a simplest volume in an N-dimensional parameter area.

The ACU 142 may provide the matching impedance 183 (e.g., tuner impedance) to the machine-learning model 114. Without the machine-learning model 114, the ACU 142 may incrementally or iteratively adjust the impedance tuner settings of the impedance tuner 53 to meet the target impedance(s). However, the ACU 142 may overshoot, causing local minima in which the values of the capacitors 92, inductors 94, and/or the resistor 96 are not as accurate due to the incremental or iterative adjustments. The overshooting may result in poor isolation and communication quality. The machine-learning model 114 may output tuning states 187 based on the received matching impedance 183. The tuning states 187 may indicate the impedance tuner settings, such as the values of one or more capacitors 92 for the target frequency. Similarly, the ACU 142 may provide matching impedances 183 for additional frequencies and the machine-learning model 114 may provide the corresponding tuning states 187, including values of the capacitors 92 for each of the frequencies (e.g., a set of capacitor values for the matching impedance 183 for a particular frequency).

The machine-learning model 114 may receive the matching impedance 183 from the ACU 142 and provide the corresponding tuning state 187 (e.g., using an inverse machine-learning model 114) for the matching impedance 183. That is, rather than applying impedance tuner settings and comparing the resulting impedance with the received matching impedance 183 (e.g., using a forward machine-learning model 114), the machine learning model 114 may be trained with data that facilitates efficiently identifying the particular tuning state 187 (e.g., impedance tuner settings) that results in a matching impedance 183, and further avoids risk of local minima.

The machine-learning model 114 may provide a set of values of the impedance tuner settings for the matching impedance 183. For example, and as show, the machine-learning model 114 may receive a first matching impedance 183 ($Z_{f1}$) for a first frequency ($f_1$) and the machine-learning model 114 may provide the tuning states 187, which includes values for capacitive, inductive, and/or resistive components of the impedance tuner 53, such as values for capacitors 92, $C_1$ through $C_N$. Similarly, the machine-learning model 114 may receive a second matching impedance 183 ($Z_{f2}$) for a second frequency ($f_2$) and the machine-learning model 114 may provide the tuning states 187, which includes values for capacitors 92 $C_1$ through $C_N$. In some embodiments, the machine-learning model 114 may additionally or alternatively provide values for a set of inductors 94 and/or a set of resistors 96. The processor 12 may apply the values to the components of the impedance tuner 53 to tune to the tuning state 187, providing sufficient isolation between the transmitter 52 and the receiver 54. As will be discussed in detail with respect to FIG. 15, the inverse model of the machine-learning model 114 may facilitate efficient and precise identification of the impedance tuner settings and prevent overshooting adjustments that may result in a mismatched tuner impedance and poorer isolation performance.

Figure 13:
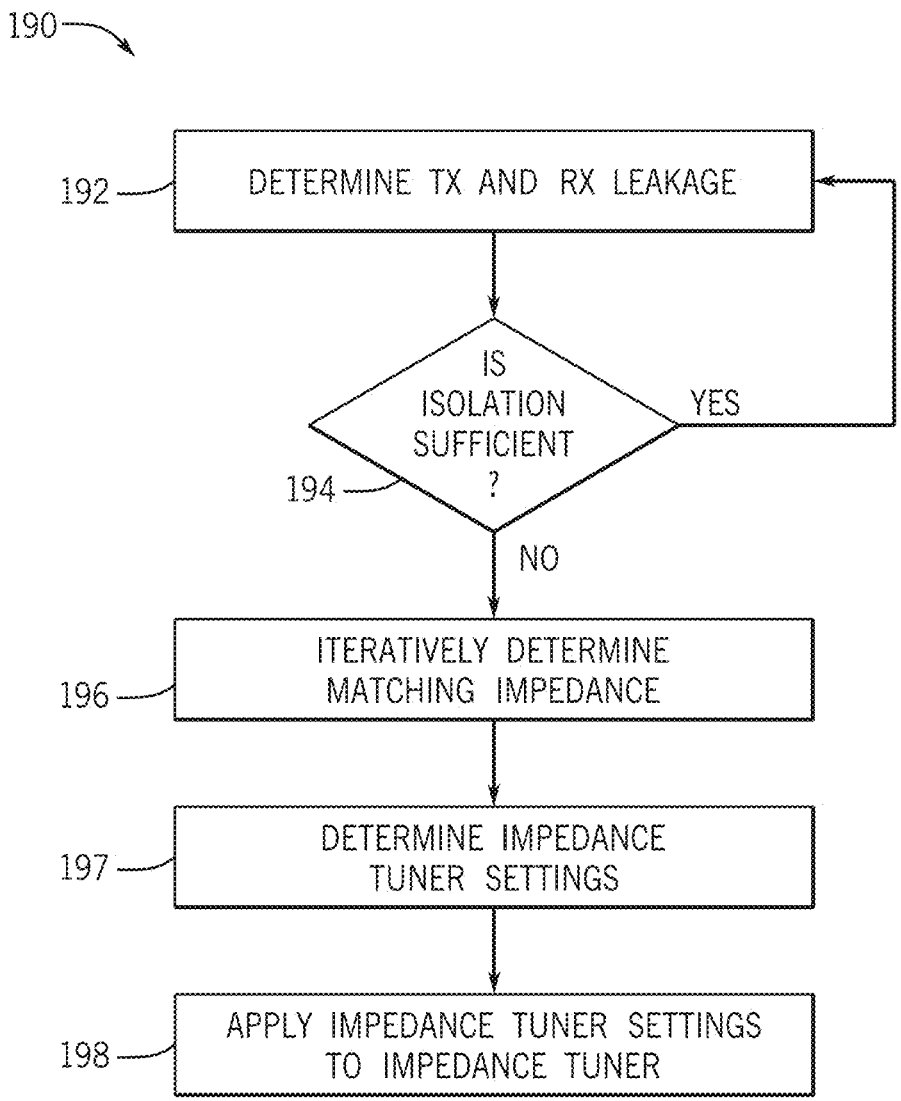
FIG. 13 is a process flow diagram for determining the impedance tuner settings based on a determined antenna impedance using the inverse machine-learning model, according to an embodiment of the present disclosure.

FIG. 13 is a process flow diagram 190 for determining the impedance tuner settings based on a determined antenna impedance 189 using the inverse machine-learning model 114, according to an embodiment of the present disclosure. The method 190 may apply to the isolation circuitry 58 without the VSWR detector 112 and the coupler 110 of FIG. 9. That is, the method 170 may also apply to the isolation circuitry 58 that does not include a device for measuring the antenna impedance of the antenna 55.

At process block 192, the processor 12 may measure the transmitter leakage and the receiver leakage 185, as discussed with respect to process block 132 of FIG. 8. At decision block 194, the processor may determine whether there is sufficient isolation between the transmitter 52 and the receiver 54, as discussed with respect to the decision block 134 of FIG. 8. At process block 196, the processor 12 (e.g., using the ACU 142) may iteratively determine antenna impedance 189 based on previous antenna impedances 189. Specifically, the processor 12 may determine a matching impedance 183 and provide the matching impedance 183 to the machine-learning model 114 that performs inverse modeling, as discussed with respect to FIG. 12. As previously mentioned, the ACU 142 may incrementally or iteratively determine and output the matching impedance 183 (e.g., for retuning the impedance tuner 53) that matches or approximately matches the antenna impedance 189 since antenna impedance 189 may change often (e.g., as the electronic device 10 moves and environmental factors affect performance of antenna 55). In some embodiments, the ACU 142 may employ, one or more optimization algorithms of the ACU 142 (e.g., downhill simplex method, the Nelder-Mead method, the amoeba method, the polytope method, or the like) to match the impedance tuner 53 impedance to the antenna impedance 189.

At process block 197, the processor 12 may input the matching impedance 183 at the target frequency to the machine-learning model 114 (e.g., using an inverse-modeling algorithm) to determine tuning states 187 or impedance tuner settings (e.g., values of capacitors, inductors, and/or resistors) of the impedance tuner 53, as discussed with respect to FIG. 12. The machine-learning model 114 may be trained with previous data that correlates the values to the matching impedance 183 at the target frequency. In this manner, the machine-learning model 114 may efficiently identify the optimal impedance tuner settings (e.g., tuning states 187) for the matching impedance 183. After determining the impedance tuner settings, at process block 198, the processor 12 may apply the impedance tuner settings to the impedance tuner 53.

Figure 14:
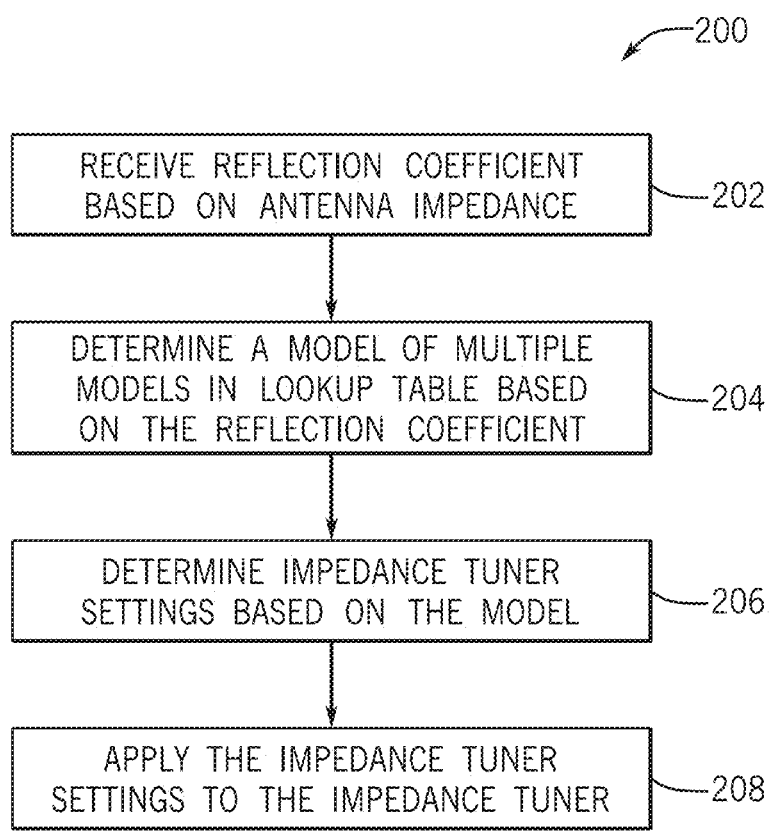
FIG. 14 is a process flow diagram for selecting a machine-learning model of multiple machine-learning models, according to an embodiment of the present disclosure.

After determining the antenna impedance, the isolation circuitry 58 may use a single model or the same machine-learning model 114 for determining the impedance tuner settings for the impedance tuner 53 based on an antenna reflection coefficient. The antenna reflection coefficient may be determined based on the antenna impedance 189. However, determining impedance tuner settings for the matching impedance 183 based on the antenna reflection coefficient may vary based on one or more ranges of reflection coefficients. As such, the isolation circuitry 58 may not accurately determine the impedance tuner settings for the varying impedance tuner settings corresponding to different ranges of reflection coefficients. FIG. 14 is a process flow diagram of a method 200 for selecting a machine-learning model of multiple machine-learning models, according to an embodiment of the present disclosure. Method 200 may apply to determining the impedance tuner settings of FIGS. 8, 11, and 13. That is, the selection of the model of multiple models for determining the impedance tuner settings applies to the isolation circuitry 58 that includes or does not include an impedance measuring device (e.g., VSWR detector 112). At process block 202, the processor 12 may determine or receive a reflection coefficient based on an antenna impedance 189. That is, the processor 12 may calculate the reflection coefficient based on the antenna impedance, which may be determined as described with respect to FIGS. 8, 11, and 13 (e.g., directly measured or estimated). At process block 204, the processor 12 may determine a machine-learning model 114 of multiple machine-learning models 114 based on the reflection coefficient. Specifically, a lookup table (e.g., stored in memory 14) may store a matrix, array, or a list that indexes the multiple machine-learning models 114 to a reflection coefficient or a range of reflection coefficients, as will be discussed in detail with respect to FIG. 15. The machine-learning models 114 may be trained with different historical data, such that the machine-learning models 114 may efficiently provide the optimal impedance tuner settings for matching impedances corresponding to reflection coefficients in the respective range of reflection coefficients of the machine-learning models 114.

At process block 206, the processor 12 may determine the impedance tuner settings based on the machine-learning model 114. That is, the processor 12 may efficiently determine the impedance tuner settings for matching the antenna impedance 189 corresponding to the reflection coefficient based on the machine-learning model 114 optimized for the reflection coefficient. Specifically, the selected machine-learning model 114 (e.g., inverse model) may provide the impedance tuner settings for tuning the impedance tuner 53. At process block 208, the processor 12 may apply the impedance tuner settings to the impedance tuner 53.

Figure 15:
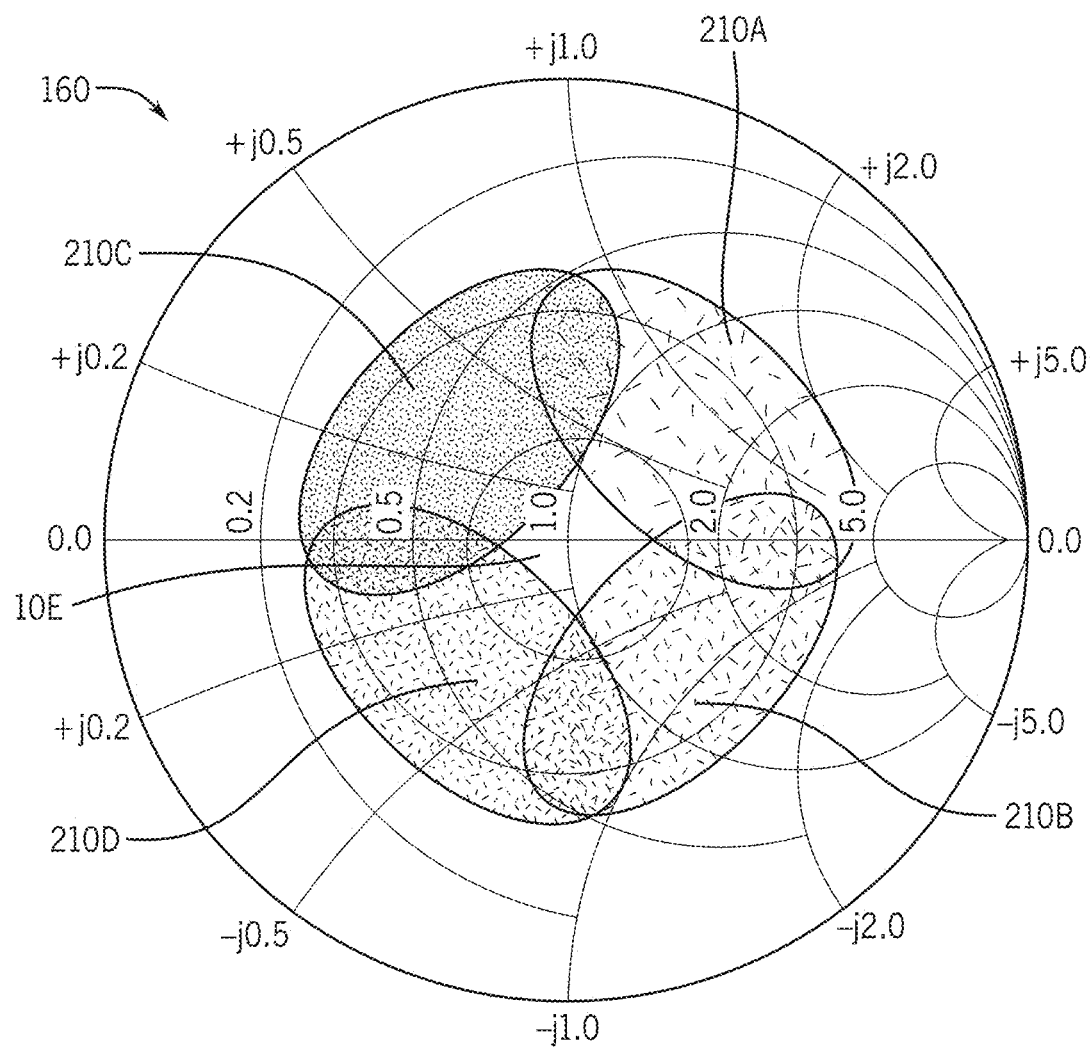
FIG. 15 is a Smith chart mapping multiple machine-learning models to corresponding reflection coefficients, according to an embodiment of the present disclosure.

FIG. 15 is a Smith chart 160 mapping multiple machine-learning models 114 to corresponding reflection coefficients (or ranges of reflection coefficients), according to an embodiment of the present disclosure. As shown, the Smith chart 160 illustrates a first mapping 210A corresponding to a first machine-learning model 114, a second mapping 210B corresponding to a second machine-learning model 114, a third mapping 210C corresponding to a third machine-learning model 114, a fourth mapping 210D corresponding to a fourth machine-learning model 114, and a fifth mapping 210E corresponding to a fifth machine-learning model 114. As shown, each of the mappings 210 may cover a range of reflection coefficients on the Smith chart 160. In some instances, a region of the range of reflection coefficients of a model may overlap with another region of a range of reflection coefficients of another model. In the overlapping regions, the machine-learning models 114 may provide a seamless handoff, such that the impedance provided by the impedance tuner settings between the models may be similar (e.g., within a threshold difference). To select a single model in the overlapping region, the processor 12 may select a first impedance tuner setting from a first model, measure the tuner impedance, retune to a second tuner setting from a second model, measure the tuner impedance, and compare the measured tuner impedances to the antenna impedance. The processor 12 may select the first or the second model based on the measured tuner impedance being closer to the antenna impedance (e.g., model reflection coefficient closer to antenna reflection coefficient). Selecting one of the relatively small multiple machine-learning models 114 rather than using a single large machine-learning model 114 (e.g., covering the entire reflection coefficient range of the smaller machine-learning models mappings 210 on Smith chart 160) may facilitate precisely and efficiently selecting the impedance tuner settings for the matching impedance 183.

Figure 16:
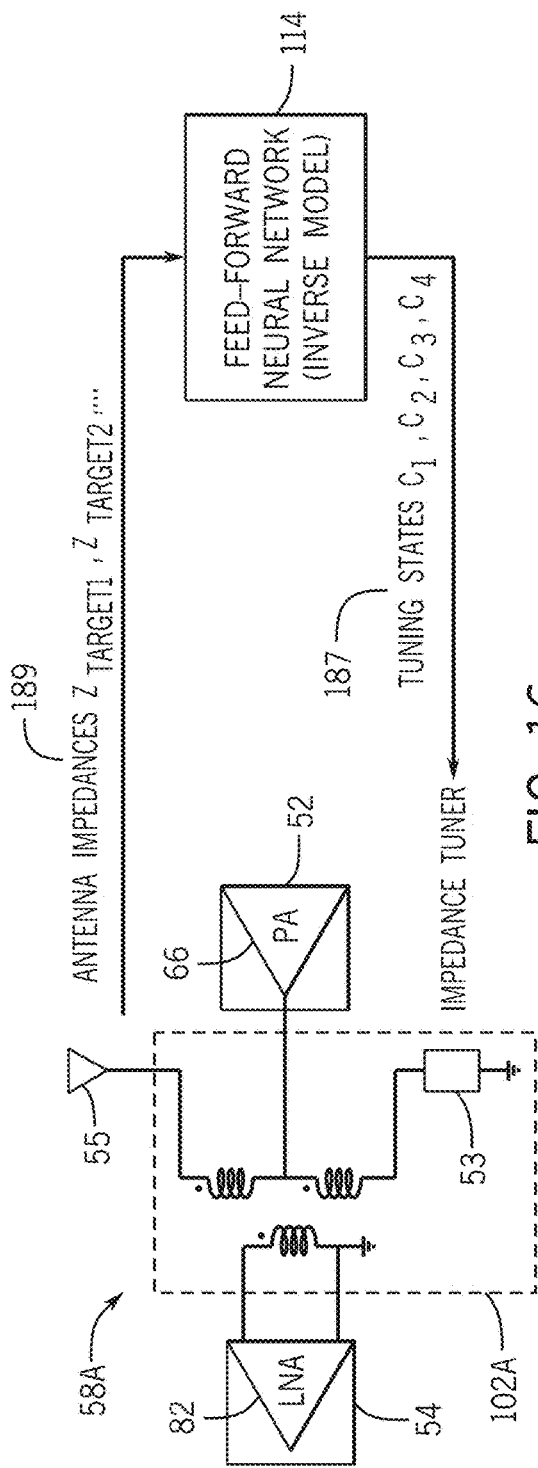
FIG. 16 is a schematic diagram of isolation circuitry of the transceiver circuitry of FIG. 3 having an electrical balanced duplexer, according to an embodiment of the present disclosure.

FIG. 16 is a schematic diagram of isolation circuitry 58A of the transceiver circuitry of FIG. 3 having an electrical balanced duplexer 102A, according to an embodiment of the present disclosure. Generally, the isolation circuitry 58A may match the impedance of the impedance tuner 53 to the antenna impedance 189 (e.g., determine reflection coefficient for impedance tuner 53 of the phased balance duplexer 102B based on the antenna reflection coefficient). As shown and as previously mentioned, the electrical balanced duplexer 102A may be integrated with or coupled to an impedance tuner 53 and an antenna 55, a transmitter 52, and a receiver 54, and a machine-learning model 114. The isolation circuitry 58 may determine the antenna impedance 189 using the VSWR detector 112 as described with respect to FIG. 7, or using a post processing unit 116 or a power detector 118, as described with respect to FIG. 9.

As shown, the isolation circuitry 58 may send the antenna impedance to the machine-learning model 114. The machine-learning model may include training data communicated in a feed-forward neural network or the like. That is, the isolation circuitry 28 may communicate the training data in one direction, forward, from input nodes to the output nodes. (e.g., no cycles or loops in the network). The input nodes may communicate inputs of the antenna impedances 189 (Zn) that are sent in a forward direction, processed, and sent to the output nodes. The output nodes may include outputs of the tuning states 187 for the tuner impedance settings of the impedance tuner 53 to provide an impedance matching the antenna impedance 189. As previously discussed, the tuning states 187 may include the impedance tuner settings, such as the values of impedance tuner components (e.g., capacitors 92).

Figure 17:
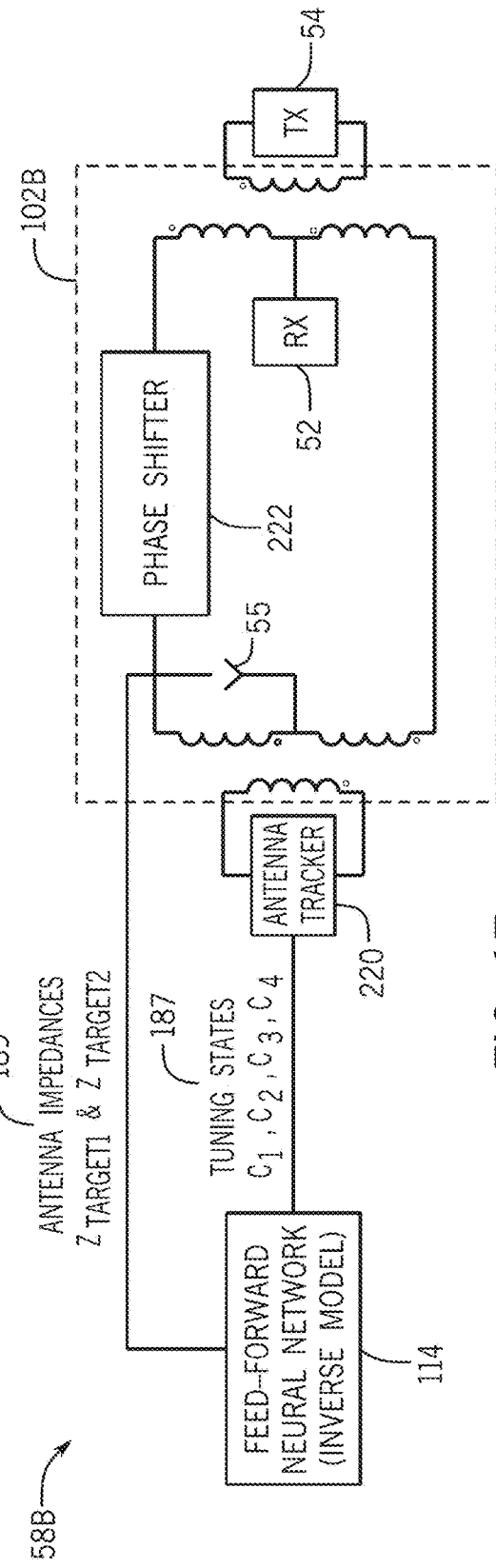
FIG. 17 is a schematic diagram of isolation circuitry of the transceiver circuitry of FIG. 3 having a phase balanced duplexer, according to an embodiment of the present disclosure.

FIG. 17 is a schematic diagram of isolation circuitry 58B of the transceiver circuitry of FIG. 3 having a phase balanced duplexer 102B, according to an embodiment of the present disclosure. Generally, the isolation circuitry 58B may match the impedance of the impedance tuner 53 to an inverse of the antenna impedance 189 (e.g., determine reflection coefficient for impedance tuner 53 of the phased balance duplexer 102B based on an inverse of the antenna reflection coefficient). As shown and as previously mentioned, the phased balanced duplexer 102B may be integrated with or coupled to an impedance tuner 53 and an antenna 55, a transmitter 52, and a receiver 54, and a machine-learning model 114. The isolation circuitry 58B and the phased balanced duplexer 102B may operate similarly and provide similar functionality as the isolation circuitry 58A and the electrical balanced duplexer 102A of FIG. 16. The phase balanced duplexer 102B also includes an antenna tracker 220 and a phase shifter 222.

The antenna tracker 220 may track the impedance and/or the phase of signals at the antenna 55. The phase shifter 222 may tune phases of transmission and/or reception signals to decrease insertion loss. In the current embodiment, the tuning states 187 may also provide phase component values for tuning phase components of the isolation circuitry 58 to account for insertion loss or a phase difference due to the phase shift of the output signal. In this manner, the systems and methods described herein facilitate efficiently and accurately determining antenna impedances 189 with or without antenna impedance measuring devices. Accurately determining the antenna impedance 189 facilities efficiently determining a matching impedance 183 for the impedance tuner 53.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ," it is intended that such elements are to be interpreted under 35 U.S.C. 112(f). However, for any claims containing elements designated in any other manner, it is intended that such elements are not to be interpreted under 35 U.S.C. 112(f).

It is well understood that the use of personally identifiable information should follow privacy policies and practices that are generally recognized as meeting or exceeding industry or governmental requirements for maintaining the privacy of users. In particular, personally identifiable information data should be managed and handled so as to minimize risks of unintentional or unauthorized access or use, and the nature of authorized use should be clearly indicated to users.

The invention claimed is:

1. A method for adjusting an impedance tuner of a duplexer of an electronic device, comprising:
   receiving, via processing circuitry of the electronic device, a plurality of test impedance settings of the impedance tuner for transmitting a plurality of test transmission signals and for receiving a plurality of test reception;
   receiving, via the processing circuitry, a plurality of transmitter leakage values and a plurality of receiver leakage values based on the plurality of test impedance settings; and
   adjusting, via the processing circuitry, the impedance tuner based on the plurality of transmitter leakage values and the plurality of receiver leakage values.

2. The method of claim 1, wherein the plurality of test impedance settings comprises at least three impedance settings.

3. The method of claim 1, comprising determining, via the processing circuitry, a plurality of reflection coefficients based on the plurality of test impedance settings.

4. The method of claim 3, comprising determining, via the processing circuitry, an estimated antenna impedance based on the plurality of transmitter leakage values, the plurality of receiver leakage values, and the plurality of reflection coefficients, wherein adjusting, via the processing circuitry, the impedance tuner is based on the estimated antenna impedance.

5. The method of claim 1, comprising:
   determining, via the processing circuitry, an estimated antenna impedance based on the plurality of transmitter leakage values and the plurality of receiver leakage values; and
   adjusting, via the processing circuitry, the impedance tuner by determining one or more capacitor values, one or more inductor values, or both, of the impedance tuner that correlate to the estimated antenna impedance.

6. The method of claim 1, comprising:
determining, via the processing circuitry, an estimated antenna impedance based on the plurality of transmitter leakage values and the plurality of receiver leakage values; and
adjusting, via the processing circuitry, the impedance tuner by causing a machine-learning model to perform inverse modeling that correlates one or more capacitor, one or more inductor values, or both, of the impedance tuner to the estimated antenna impedance.

7. The method of claim 1, wherein the duplexer comprises a phase balanced duplexer or an electrical balanced duplexer.

8. An electronic device, comprising:
an antenna;
a transmitter communicatively coupled to the antenna and configured to send a transmission signal via the antenna;
a receiver communicatively coupled to the antenna and configured to receive a reception signal via the antenna;
isolation circuitry communicatively coupled to the transmitter and the receiver and configured to isolate the transmitter from the reception signal and isolate the receiver from the transmission signal, the isolation circuitry comprising an impedance tuner configured to output an impedance that correlates to an antenna impedance of the antenna; and
processing circuitry configured to apply a plurality of test impedance settings to the impedance tuner, receive a plurality of transmitter leakage values and a plurality of receiver leakage values based on applying the plurality of test impedance settings, and adjust the impedance tuner based on the plurality of transmitter leakage values and the plurality of receiver leakage values.

9. The electronic device of claim 8, wherein the plurality of test impedance settings comprises at least three impedance settings.

10. The electronic device of claim 8, wherein the processing circuitry is configured to determine a plurality of reflection coefficients based on the plurality of test impedance settings.

11. The electronic device of claim 10, wherein the processing circuitry is configured to determine an estimated antenna impedance based on the plurality of transmitter leakage values, the plurality of receiver leakage values, and the plurality of reflection coefficients, wherein adjusting the impedance tuner is based on the estimated antenna impedance.

12. The electronic device of claim 8, comprising a machine-learning model, wherein the processing circuitry is configured to:
determine an estimated antenna impedance based on the plurality of transmitter leakage values and the plurality of receiver leakage values; and
adjust the impedance tuner by causing the machine-learning model to perform inverse modeling that correlates one or more capacitor or inductor values of the impedance tuner to the estimated antenna impedance.

13. The electronic device of claim 12, comprising a plurality of machine-learning models that each correspond to a respective range of impedances.

14. The electronic device of claim 13, wherein the plurality of machine-learning models comprises the machine-learning model, the machine-learning model corresponding to a range of impedances that includes the estimated antenna impedance, and the processing circuitry configured to select the machine-learning model from the plurality of machine-learning models based on the range of impedances including the estimated antenna impedance.

15. A tangible, non-transitory, computer-readable medium storing computer-readable instructions configured to cause a processor of an electronic device to:
apply a plurality of test impedance settings to an impedance tuner of the electronic device;
receive a plurality of transmitter leakage values and a plurality of receiver leakage values based on applying the plurality of test impedance settings; and
adjust the impedance tuner based on the plurality of transmitter leakage values and the plurality of receiver leakage values.

16. The tangible, non-transitory, computer-readable medium of claim 15, wherein the computer-readable instructions are configured to cause the processor to determine a plurality of reflection coefficients based on the plurality of test impedance settings.

17. The tangible, non-transitory, computer-readable medium of claim 16, wherein the computer-readable instructions are configured to cause the processor to determine an estimated antenna impedance based on the plurality of transmitter leakage values, the plurality of receiver leakage values, and the plurality of reflection coefficients, wherein adjusting the impedance tuner is based on the estimated antenna impedance.

18. The tangible, non-transitory, computer-readable medium of claim 16, the computer-readable instructions are configured to cause the processor to:
determine an estimated antenna impedance based on an overlap between the plurality of reflection coefficients; and
adjust the impedance tuner by determining one or more capacitor values, one or more inductor values, or both, of the impedance tuner that correlate to the estimated antenna impedance.

19. The tangible, non-transitory, computer-readable medium of claim 15, wherein computer-readable instructions are configured to cause the processor to:
determine an estimated antenna impedance based on the plurality of transmitter leakage values and the plurality of receiver leakage values; and
adjust the impedance tuner by causing a machine-learning model to perform inverse modeling that correlates one or more capacitor or one or more inductor values of the impedance tuner to the estimated antenna impedance.

20. The tangible, non-transitory, computer-readable medium of claim 19, wherein the machine-learning model corresponds to a range of impedances that includes the estimated antenna impedance, and wherein computer-readable instructions are configured to cause the processor to select the machine-learning model from a plurality of machine-learning models based on the range of impedances including the estimated antenna impedance.

* * * * *